US005572733A

United States Patent [19]
Ryu et al.

[11] Patent Number: 5,572,733
[45] Date of Patent: Nov. 5, 1996

[54] DATA PROCESSING SYSTEM WHICH EXECUTES COMPOSITE OBJECTS BY COMBINING EXISTING OBJECTS

[75] Inventors: Tadamitsu Ryu; Hiroyuki Izumi; Masahiko Murakawa; Masanobu Toyota; Takeshi Adachi, all of Kawasaki; Naomi Ichikawa, Yokohama, all of Japan

[73] Assignee: Fujitsu Limited, Kawasaki, Japan

[21] Appl. No.: 247,695

[22] Filed: May 23, 1994

[30] Foreign Application Priority Data

May 25, 1993 [JP] Japan .................................. 5-122561

[51] Int. Cl.$^6$ ...................................................... G06F 9/00
[52] U.S. Cl. ................................. 395/701; 364/DIG. 1; 364/280
[58] Field of Search ...................................... 395/650, 700

[56] References Cited

U.S. PATENT DOCUMENTS

| | | | |
|---|---|---|---|
| 5,421,016 | 5/1995 | Conner et al. | 395/700 |
| 5,475,817 | 12/1995 | Waldo et al. | 395/700 X |
| 5,481,718 | 1/1996 | Ryu et al. | 395/700 |
| 5,499,371 | 3/1996 | Henninger et al. | 395/700 |
| 5,511,199 | 4/1996 | Anthias et al. | 395/700 |

Primary Examiner—Thomas M. Heckler
Attorney, Agent, or Firm—Staas & Halsey

[57] ABSTRACT

A data processing system for executing a process. Classes and composite classes are formed by combining methods. Instances are formed and correspond to the classes and composite classes. The real world is analyzed as an object model which includes a static world, a dynamic world and a cause and effect relationship. The object model has a corresponding extension and a corresponding connotation. The connotation is in an information concealed region, and identification information identifies the extension and connotation. A system mechanism is created with respect to the static world using the classes and composite classes, where the system mechanism is a static model for the static world. The instances are used to form a session corresponding to motion with respect to the dynamic world, where the session is a dynamic model for the dynamic world. The cause and effect relationship of the object model is generated from the dynamic model into the static model. A functional model is formed in the connotation, and includes composite objects formed from the methods, the classes, the composite classes and the session. A minimum number of methods, classes, and composite classes required to form the composite objects of the functional model are stored in the connotation. The identification information is used to assign object identifications to composite objects of the functional model, to identify composite objects of the functional model. A process is then executed by using the object identifications to identify composite objects of the function model.

6 Claims, 19 Drawing Sheets

DATA PROCESSING SYSTEM WHICH EXECUTES COMPOSITE OBJECTS BY COMBINING EXISTING OBJECTS

BACKGROUND OF THE INVENTION

The present invention generally relates to data processing systems, and more particularly to a data processing system which regards the real world as an object model, makes the real world correspond to an extension and a connotation, places the connotation in an information concealed region, makes identification information which specifies the connotation correspond to the extension, and describes the real world by a static world and a dynamic world which form an object world in correspondence with the extension. A system mechanism is given to the static world by classes and/or composite classes. The movement in a dynamic model is given to the dynamic world by instances of the classes and/or composite classes. An object identification is added with respect to the individual objects forming each composite object. The composite objects used in the data processing system can be specified by the groups of the object identifications which are added to the individual objects.

First, a description will be given of a conceivable method of forming a capsule of objects, by referring to FIGS. 1A through 1C.

For example, execution process data 214 are made up of a series of instructions (or instruction groups) 250 shown in FIG. 1A which are serialized in the processing sequence. A number of such instructions (or instruction groups) 250 form a processing unit 251 which executes a predetermined process, that is, performs a certain behavior.

Accordingly, the execution process data 214 shown in FIG. 1A may be regarded as a collection of the processing units 251 which are serialized in the processing sequence as shown in FIG. 1B, where each processing unit 251 performs a certain behavior. The serialized execution process data 214 shown in FIG. 1B as a whole carry out a specific operation. Hence, the execution process data 214 for carrying out another specific operation is a connection of the processing units 251 having a different combination.

As the number of existing processing units 251 which perform different behaviors becomes large, the individual processing units 251 are integrated under a predetermined method M as shown in FIG. 1C, so as to obtain an integrated processing unit group which carries out the same operation as the execution process data 214 shown in FIG. 1B.

Next, a description will be given of particular examples of the relationships of the object, the object command and the object part.

FIG. 2 shows a real world, that is, an example of a model for departments of a company. Within a box representing "employees" in FIG. 2, there is a "secretary" belonging to a "work type=1", a "leader" belonging to a "work type=2", and a "worker" belonging to a "work type=3". A box representing "employees" belongs to a box representing a "team".

The "leader" is related to the "team" under the relationship "team leader". In addition, the "worker" is related to a "machine" under the relationship "worker/machine" within the box representing "work unit".

The "team" and the "machine" are related under the relationship "machine/workshop". The "worker" and the "machine" are related under the relationship "machine/worker". In addition, the "employee" and the "department/employee" are related under the relationship "department/employee".

Furthermore, the "employee" and the "position" are related under the relationship "employee/attribute". The "work unit" and the "part" are related under the relationship "work unit/part".

The following relationships also exist.

(1) The "department" is related to the object "department name" and the object "dollars".
(2) The "team" is related to the object "name" by a team identification number, related to the object "employee number" by the work type, related to the object "code name" and the object "surname" by the name, related to the object "dollars" by the salary, related to the object "dollars" by the average salary, and related to the object "number" by the average number of departments.
(3) The "secretary" is related to the object "number" by the typing speed.
(4) The "position" is related to the object "name" by the name, and related to the object "year" by the age.
(5) The "part" is related to the object "part number" and the object "dollars".
(6) The "work unit/part" is related to the object "number" by the volume.
(7) The "work unit" is related to the object "time" by the required time.
(8) The "machine" is related to the object "machine number", the object "dollars" and the object "machine name".
(9) The "machine/work" is related to the object "time" by the time used.

The model shown in FIG. 2 can generally be represented as shown in FIG. 3 if the "behavior" (or method) is indicated by an oval, the "data" is indicated by a rectangular box, and the "relationship" is indicated by a rhombic box. In other words, (1) a method "a" and a data "I" are combined and function as one larger data "IV", (2) methods "b" and "c" are related to a data "II" by a relationship "α" and function as one larger data "V", (3) methods "c" and "d" are related to a data "III" by a relationship "β" and function as one larger data "VI", and (4) a method "e" is related to data "IV" and "V" by a relationship "υ" and function as still a larger data "VII". In other words, the behaviors (or methods) are gathered and represented as a larger group.

Each oval, rectangular box and rhombic box shown in FIG. 3 can be treated as an individual object.

The forming of a capsule shown in FIG. 4A will now be considered for a collection of the method "a" and the data "I" shown in FIG. 3. In FIG. 4A, an opening is formed at the top of the capsule to indicate that a message communication can be made. If this opening of the capsule were closed as shown on the left side of FIG. 4B, such a capsule would then correspond to the data "IV" which is a collection of the method "a" and the data "I" in FIG. 3. If a composite object is obtained by adding a method "M" to the data "D" (capsule) shown on the left side of FIG. 4B, the data shown at the central part of FIG. 4B is obtained. Further, if a composite object is obtained by further adding a method to the data shown at the central part of FIG. 4B, the data shown on the right side of FIG. 4B is obtained. Hence, FIG. 4B shows the formation of composite objects by successively adding methods.

The formation of the composite objects is not limited to that shown in FIG. 4B. For example, the composite objects may be formed as shown in FIG. 4C. In FIG. 4C, the data "D" of the object shown on the leftmost side is replaced by an object which is made up of a method and a data, as shown on the second leftmost side. In this case, a message passing is required between a method "M1" and a data "D1", and the method "M1" becomes one object as shown on the second rightmost side in FIG. 4C. As a result, objects "A" and "B" exist within an object "C", and the message passing exists between the objects "A" and "B".

Furthermore, if the method "M" of the object "B" is replaced by an object "B1" and the data "D" of the object "B" is replaced by an object "B2", both the object "B1" and "B2" exist within the object "B" and the message passing exists between the objects "B1" and "B2" as shown on the rightmost side in FIG. 4C.

Therefore, the composite objects are formed by successively combining the objects. For example, the so-called primitive objects which will be described later are combined to form a capsule object, the capsule objects are combined to form an event object, and the event objects are combined to form a system object.

The data "D" described above is generally made up of a plurality of processing units which are the subject of the processing. On the other hand, the method "M" may be considered as information or an information group instructing how the plurality of processing units are to be utilized. The object which is represented in FIG. 4 is a "processing unit" which is treated as an individual "processing unit" or a collection of "individual processing units".

As shown in FIG. 3, the individual objects "I", "II" and "III" form a part of the larger objects "IV", "V" and "VI". In addition, the objects "IV", "V" and "VI" form a part of still a larger object "VII". In other words, the objects "IV", "V" and "VI" are in an "is-a" relationship or a "part-of" relationship with the object "VII" when viewed from the object "VII".

If the objects "I", "II" and "III" are regarded as minimum units, these objects "I", "II" and "III" may be said to be primitive objects. The capsule object is formed by a collection of such primitive objects. The event object is formed by a collection of such capsule objects. Furthermore, a still larger system object is formed by a collection of such event objects.

The objects described above which are made up of a collection of smaller objects are respectively referred to as a composite object. The primitive object is included in the concept of the composite object. However, the primitive object is an object of the minimum unit as described above. For this reason, when a reference is generally made to a "composite object" or an "object", it is better to exclude the primitive object which exists by itself and cannot be decomposed further.

The object in the capsule form is generally made up of the composite objects described above in the capsule form.

As shown in FIG. 2, the objects corresponding to "processing units" are mutually complicated and related in the real world. The "processing unit" may be the individual processing unit or a collection of individual processing units.

As described above, the real world in general can be described by a model using the objects. Hence, it is possible in the data processing system related to the object orientation to regard each processing unit forming the minimum processing unit group as the primitive object, and to consider calling and using the individual objects or composite objects by combining the primitive objects if necessary and storing the same in the storage unit.

In this case, the structure stored in the file must be devised.

In other words, the following simple case will be considered for the sake of convenience. That is, (i) there exists a first composite object X which executes objects A, B and C in this sequence, (ii) there exists a second composite object Y which executes objects P, Q and R in this sequence, and (iii) there is a need for a third composite object Z which executes the objects A, B and R in this sequence. If the composite objects are each stored in the file as a single structure having a form which cannot be divided or is difficult to divide as is done conventionally in general, it is impossible to execute the objects A, B and R of the third object Z in this sequence although the file stores each of the objects A, B and R which form the third object Z, because the third object Z is not stored in the file.

SUMMARY OF THE INVENTION

Accordingly, it is a general object of the present invention to provide a novel and useful data processing system which eliminates the problems described above.

More particularly, the object of the present invention is to realize a data processing system which can execute composite objects by appropriately combining existing objects.

Another and mope specific object of the present invention is to provide a data processing system which executes a desired process by naming as objects single processing units and/or composite processing units which are combinations of the single processing units and combining the objects, comprising means for understanding a real world as an object model, for corresponding the real world to an extension and a connotation, for placing the connotation in an information concealed region, and for forming identification information which specifies the connotation in correspondence with the extension, means for describing the real world by a dynamic world and a static world forming a world of the objects in correspondence with the extension, means for giving as a static model a system mechanism with respect to the static world using classes and/or composite classes, and for giving as a dynamic model a session corresponding to a motion of the dynamic model with respect to the dynamic world using instances of the composite classes and/or the classes, means for giving cause and effect relationship generated from the dynamic model into the static model as information, means for forming the classes and/or composite classes by combing a plurality of existing and/or newly generated methods, and for forming the instances in correspondence with the classes and/or the composite classes, means for storing as a functional model the existing and/or newly generated methods, the formed classes and/or composite classes, and the session corresponding to the motion of the dynamic model in the information concealed region corresponding to the connotation as composite objects, means for naming the identification information as an object identification and storing in the connotation objects of minimum units which form the composite objects stored in the connotation as the functional model, and means for specifying an arbitrary one of the composite objects by an object identification corresponding to a group of object identifications assigned to the objects of the minimum units forming the arbitrary composite object. According to the data processing system of the present invention, it is possible to appropriately generate the necessary composite objects by combining the objects and/or composite objects placed in the information concealed world and the object identifications. In other words, it is possible to enable the process of the necessary composite object.

Other objects and further features of the present invention will be apparent from the following detailed description when read in conjunction with the accompanying drawings.

DESCRIPTION OF THE PREFERRED EMBODIMENTS

First, a description will be given of the operating principle of the present invention, by referring to FIG. 5.

Figure 5:
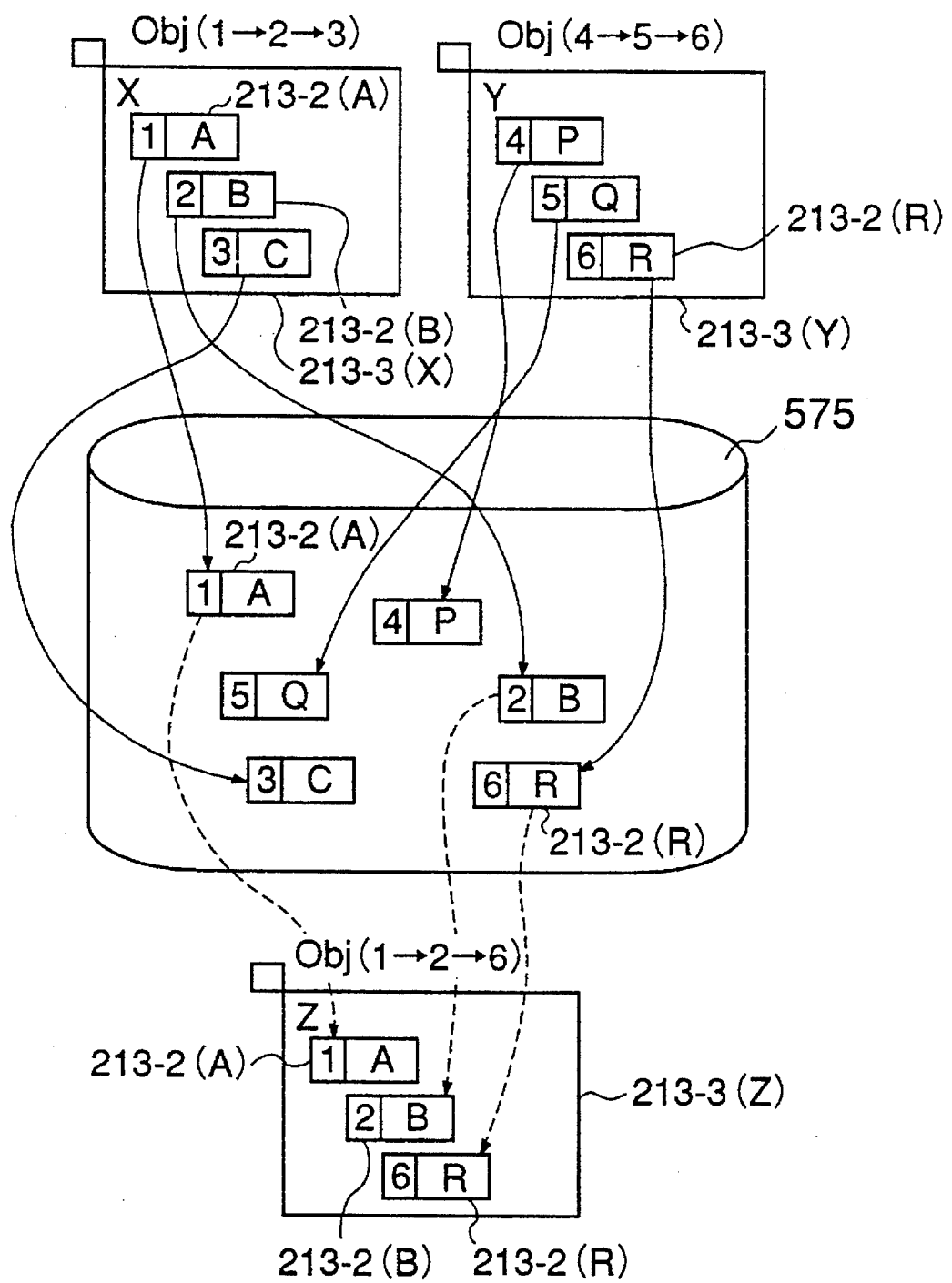
FIG. 5 is a diagram for explaining the operating principle of the present invention.

FIG. 5 shows objects 213-2, composite objects 213-3, and a file 575. In this particular case shown in FIG. 5, the object 213-2 is regarded as corresponding to the primitive object used in the present invention, but may correspond to a composite object which is obtained by combining primitive objects. In FIG. 5, reference numerals "1", "2", "3", ..., "6" shown in correspondence with each primitive object 213-2 indicates an object identification (ID) which is added to the object.

The file 575 corresponds to an information concealed world 430 which will be described later. In the present invention, the object IDs "1", "2", ..., "6" are added to each of the primitive objects 213-2 which form each composite object 213-3, and each of the primitive objects 213-2(A), 213-2(B), ..., 213-2(R) are scatteringly stored in the file 575.

When there is a request to use the primitive objects A, B and R as the third composite object Z, the primitive objects A, B and R within the file 575 are combined to obtain the third composite object Z.

Of course, if the possibility that the third composite object Z will be reused as one object at a later time by another process request is high, an appropriate object ID is added to the third composite object Z and stored in the file 575 as one object. In this case, the third composite object Z can be reduced as one object by specifying the object ID thereof.

Figure 6:
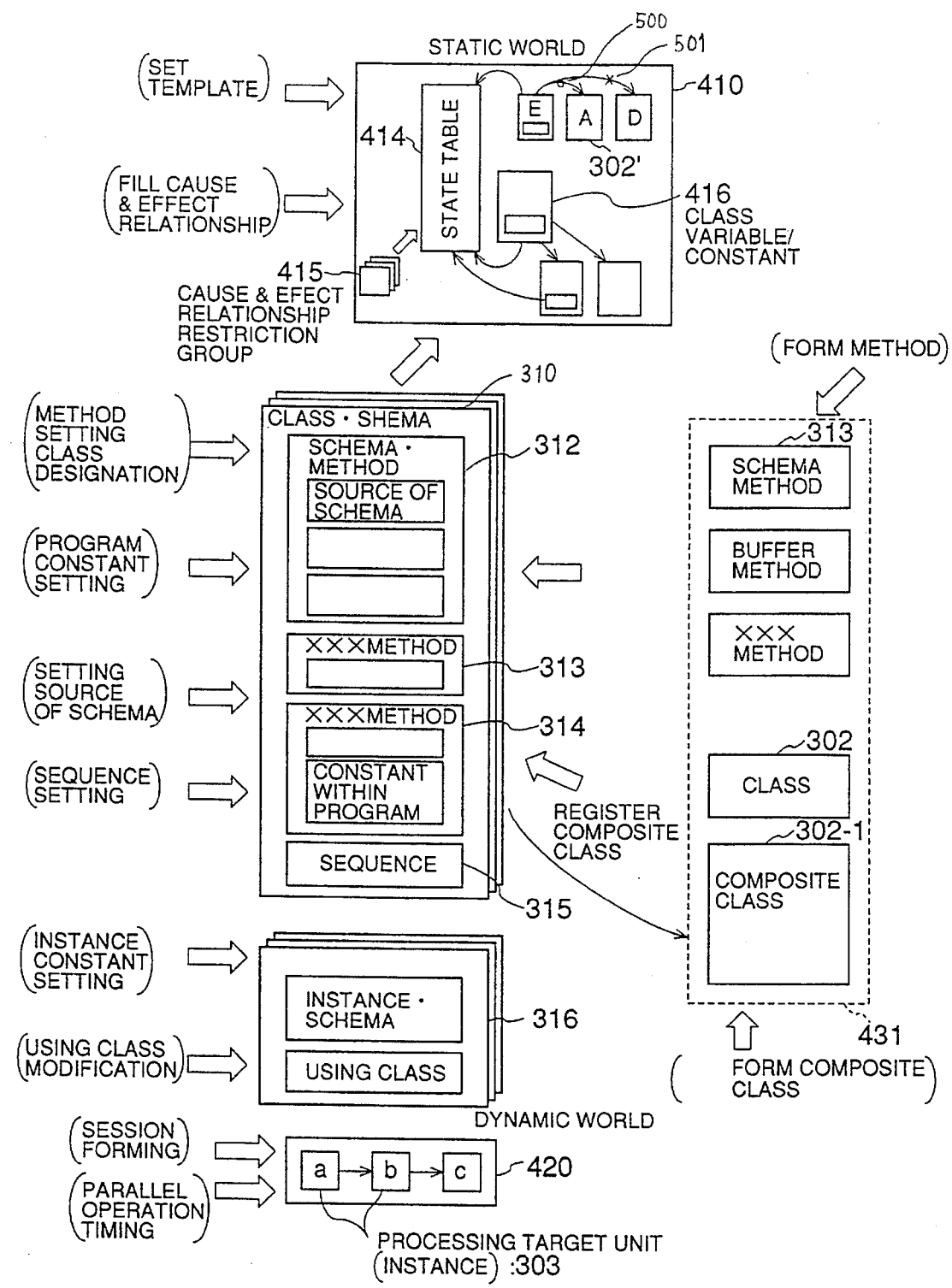
FIG. 6 is a diagram schematically showing the construction of an embodiment of a data processing system according to the present invention.

FIG. 6 schematically shows the construction of an embodiment of a data processing system according to the present invention. An internal schema 310 generates classes and composite classes in correspondence with a process request which is given a new target, and generates instances in correspondence with the generated classes and composite classes. For the sake of convenience, a reference may only be made to the class and not, to the composite class in order to simplify the description in the following.

FIG. 6 also shows a static world 410, a dynamic world 420 and a functional model 431. The real world is regarded as an object model, and the real world is made to correspond to an extension and a connotation. The data processing system includes the connotation which stores existing methods 313 and classes 302 in the information concealed world as the functional model 431. In addition, the data processing system includes the extension as the static world 410 and the dynamic world 420.

In the static world 410, a plurality of methods 313 and classes 302 are gathered as a class corresponding to the new process request, and such classes are combined to form a system mechanism for executing the new process request. In the dynamic world 420, instances corresponding to each of the classes are chained in the processing sequence with which the new process request is executed so that sessions may be formed, and the dynamic model for executing the system is given.

A class schema 312 shown in FIG. 6 is a functional part for generating the classes. Methods 313 through 315 are input by the class schema 312 as constituent elements of the classes corresponding to the new process request.

An instance schema 316 indicates a functional part for generating the instances which are made to correspond to the respective classes corresponding to the new process request.

FIG. 6 also shows instances 303, a state table 414, a cause and effect relationship restriction group 415, and a class variables and constants 416. In the state table 414, the hierarchical relationship of the plurality of classes which are input as the constituent elements are described and the class variables and constants to be used are linked in the system which is assembled to correspond to the new process request. The cause and effect relationship restriction group 415 is also written in the state table 414, and the cause and effect relationship which becomes a restriction when executing the sessions in the dynamic world 420 are described. The cause and effect relationship which indicates that an instance must already be executed in order to execute an instance b, for example, is described, and this cause and effect relationship is checked when executing the sessions.

A strong link 500 and a weak link 501 are also shown in FIG. 6. The strong link 500 indicates that information must be inherited in correspondence with the occurrence of a phenomenon. On the other hand, the weak link 501 indicates that information is inherited in correspondence with the occurrence of the phenomenon if necessary.

When there is an instruction to assemble a system corresponding to the new process request, the classes which become the constituent elements of the system are generated. When generating the classes, the methods necessary for forming the classes, the names of the classes, and the points for pointing the methods and classes are given to the class schema 312. Then, the necessary methods and classes are input from the functional model 431 to the internal schema 310. The instance schema 316 generates the instances which are necessary in order to execute the classes, in correspondence with the generation of the classes. Each of the generated instances are made to correspond to the classes which use the instances.

The classes which are generated as described above, are linked in the state table 414 within the static world 410, and become the constituent elements of the system which is assembled to correspond to the new process request. A class 302' shown in FIG. 6 indicates such a class which became the constituent element. On the other hand, in the dynamic world 420, the instances 303 are time-sequentially linked and the sessions are assembled, so as to execute the system. The system is executed by executing the sessions. Or, the system is prepared to an executable state by assembling the sessions.

The classes and composite classes corresponding to the new process request are generated in the above described manner. These classes and composite classes are held as the functional model 431, and is thereafter used for assembling a system in correspondence with another new process request. When the system is assembled, it is possible to use the strong link 500 and the weak link 501 to assemble the system depending on the needs, depending on the situation or, depending on the mood, so that the information may be inherited skillfully.

Figure 7:
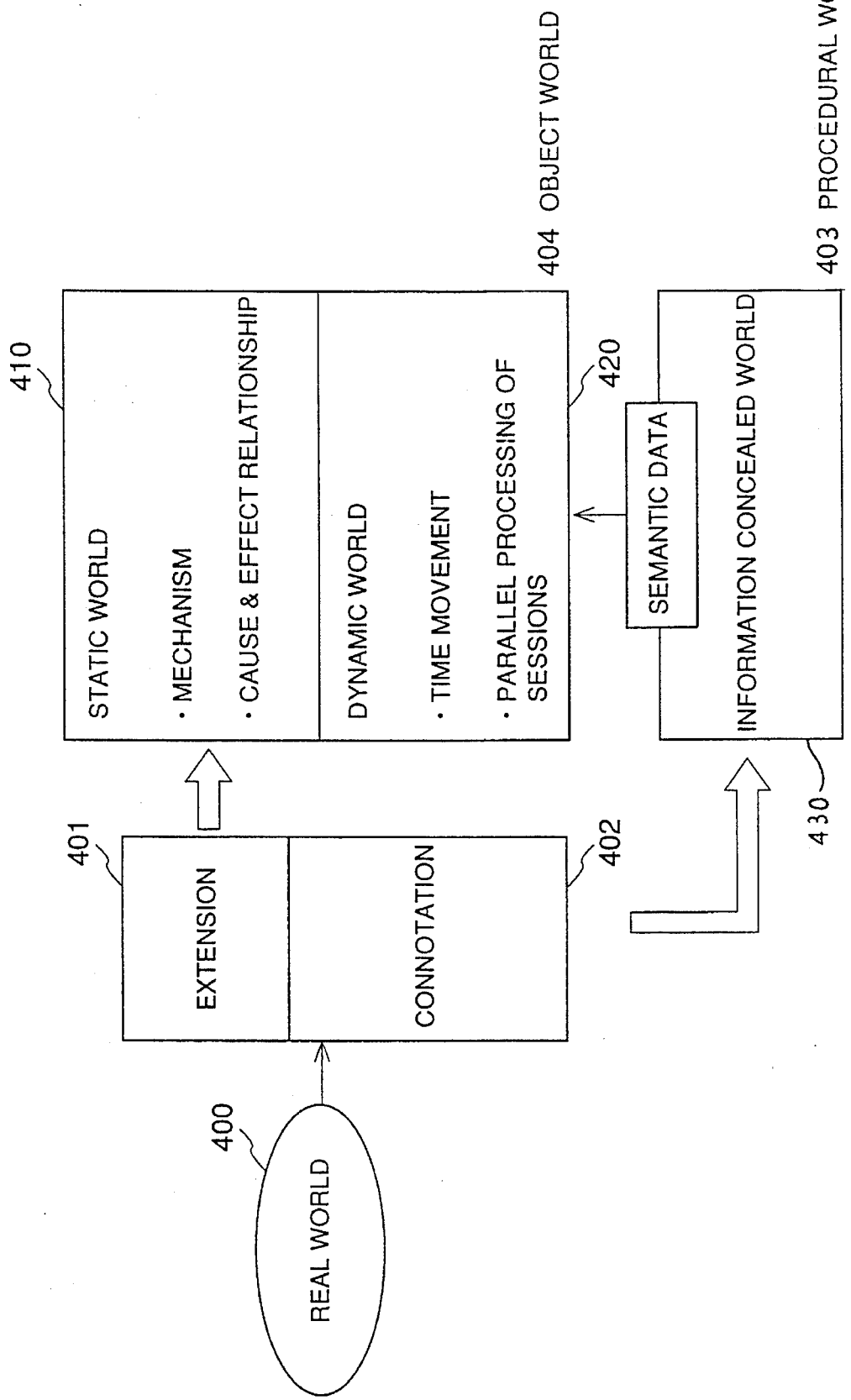
FIG. 7 is a diagram for explaining a static world and a dynamic world.
Figure 8:
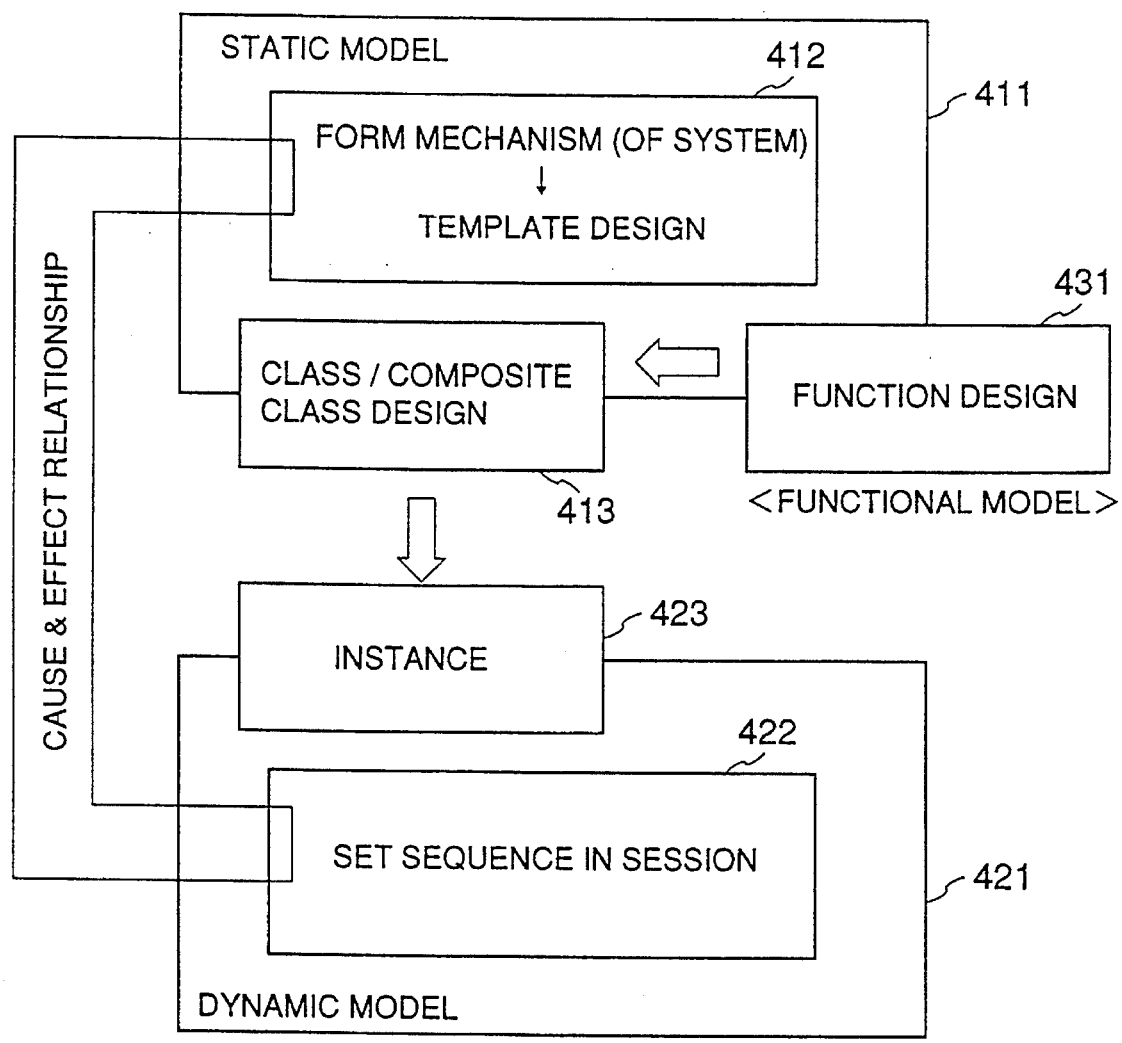
FIG. 8 is a diagram for explaining the relationships of a static model, a dynamic model and a functional model.

FIGS. 7 and 8 are diagrams for explaining the static world and the dynamic world.

The real world (for example, a request of a user) 400 can be described by a model by making a connotation 402 correspond to an extension 401, where the connotation 402 gives particular information representing the real world 400, and the extension 401 simply represents the real world 400. When exchanging information, such as exchanging information related to the certain real world 400, it is sufficient to give the extension 401 for this real world 400 if there is mutual understanding of the connotation 402 related to this real world 400. In other words, there is not need to notify the other party of the particular information each time, and it is sufficient to merely notify the name of this real world 400.

FIG. 7 is a diagram for explaining the static world and the dynamic world.

For the reasons described above, the information is generally concealed in the connotation 402, and connotation 402 corresponds to the information concealed world 430 or the procedural world 403. On the other hand, the model of the real world 400 can be formed by the static world 410 which gives the mechanism (or construction) of the real world 400 and the cause and effect relationship within this mechanism, and the dynamic world 420 which describes time movements in the real world 400 and indicates whether or not to permit parallel processing of a plurality of sessions. The correspondence between the procedural world (information concealed world) 403 and the static world 410 and the dynamic world 420 is made by the extension 401 as shown in FIG. 7.

Furthermore, the connotation 402 is the information concealed world, and includes data which give meaning (or significance) to the extension 401. The real world 400 is simulated by the extension 401 which includes this meaning (or significance). This simulation of the real world 400 gives a static model corresponding to the static world and a dynamic model corresponding to the dynamic world.

FIG. 8 is a diagram for explaining the relationships of the static model, the dynamic model and the functional model. A static model 411 shown in FIG. 8 is a model corresponding to the static world 410 shown in FIG. 7, and a dynamic model 421 shown in FIG. 8 is a model corresponding to the dynamic world 420 shown in FIG. 7. In addition, a functional model 431 shown in FIG. 8 corresponds to the information concealed world shown in FIG. 7.

By specifying the mechanism of the system and designing the "is-a" and "part-of" relationships (templates) described above, it is possible to form the static model 411. Then, the functional design is obtained, and the class 302 or a composite class 302-1 shown in FIG. 6 is designed in a corresponding manner. A plurality of classes are added or integrated to form the composite class 302-1.

The dynamic model 421 is formed by assigning instance data within the class 302 to form a specific target processing unit (instance), and designing the time sequential relationship of each of the target processing units. The restrictions of the cause and effect relationship are given between the static model 411 and the dynamic model 421.

The existing methods 313, the classes 302 and the newly generated classes are held as the functional model 431, and are used thereafter when assembling the system in correspondence with another new process request. These methods and classes are dynamically assembled as the system and used, and a dynamic object process will now be described.

Figure 9:
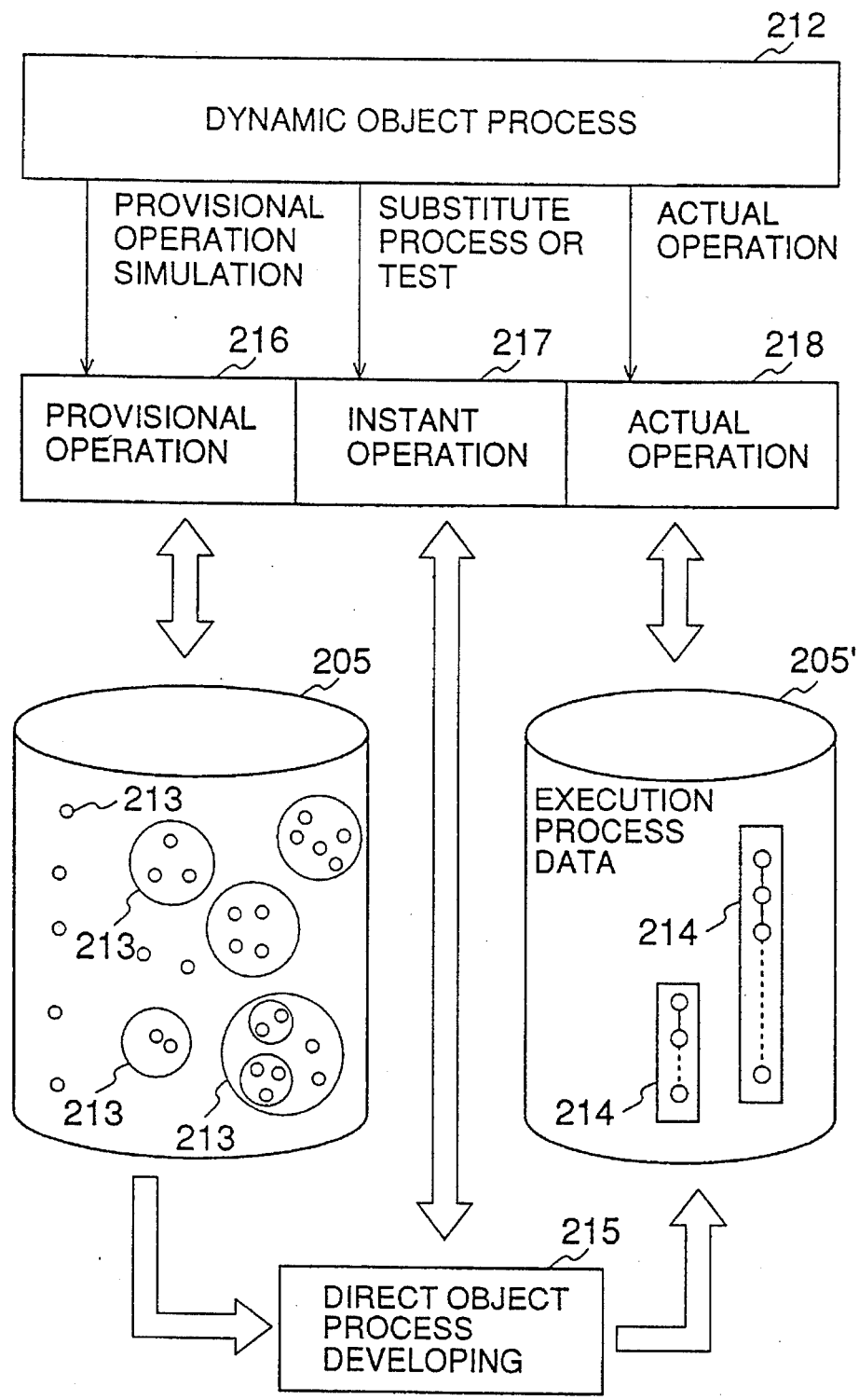
FIG. 9 is a diagram for explaining a portion of the operation of a dynamic object processor.

FIG. 9 is a diagram for explaining a portion of the operation of a dynamic object processor.

The methods and classes described above are held in a parts attribute file 205 as object parts 206 shown in FIG. 11 which will be described later. A dynamic object process part 212 shown in FIG. 9 carries out a process using the object parts 206. Of course, it is possible to appropriately combine the object parts 206 or composite object parts which are combinations of the object parts 206.

The dynamic object process part 212, shown in FIG. 9, has a provisional operation mode 216 for carrying a simulation or the like, an instant operation mode 217 for carrying out a test or the like, and an actual operation mode 218 for carrying out a data processing or a communication process with another terminal.

A file 205' holds execution process data 214 which is obtained by compiling all or a portion of the content of the parts attribute file 205 so as to enable high-speed execution. In the case of an object program for process execution, the execution process data 214 in general are processing units which are made up of several tens to several hundred steps and serially connected in the processing sequence.

The objects 213 are shown within the parts attribute file 205. Generally, the object 213 may correspond to the form of the primitive object as it is, the state of the capsule object, the state of the event object or the state of the system object. The objects 213 are stored in the form of object parts 206 so that it can be specified by the object commands.

A direct object process developing process 215 carries out a process of obtaining the execution process data 214 by developing the individual objects 213 or, developing a plurality of objects 213 as a whole.

Figure 1A:
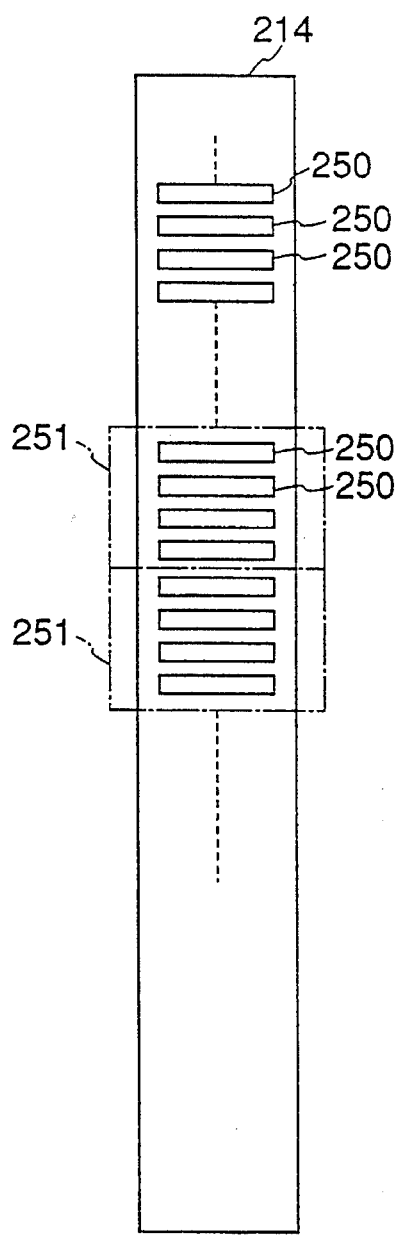
FIGS. 1A, 1B and 1C respectively are diagrams for explaining the formation of a capsule from objects.
Figure 1B:
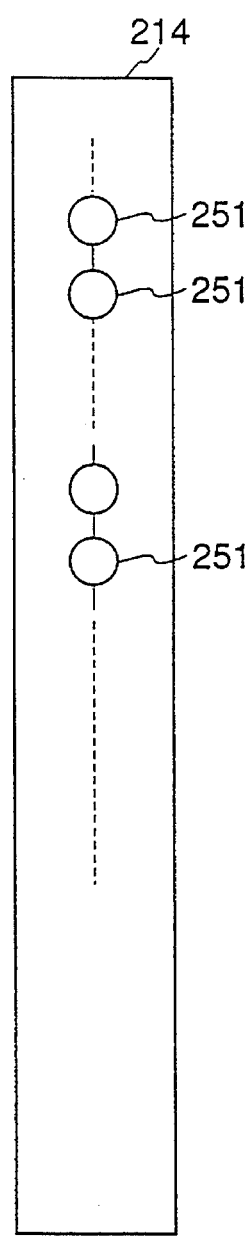
Figure 1C:
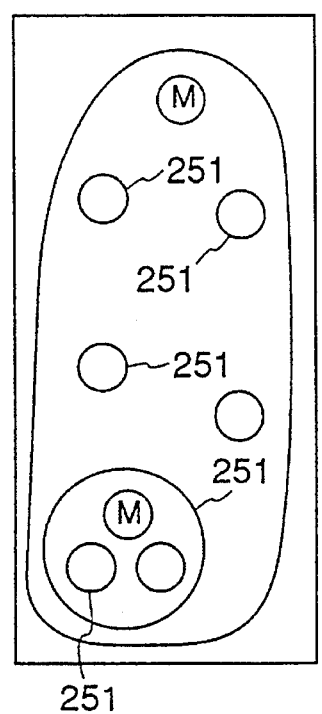
Figure 2:
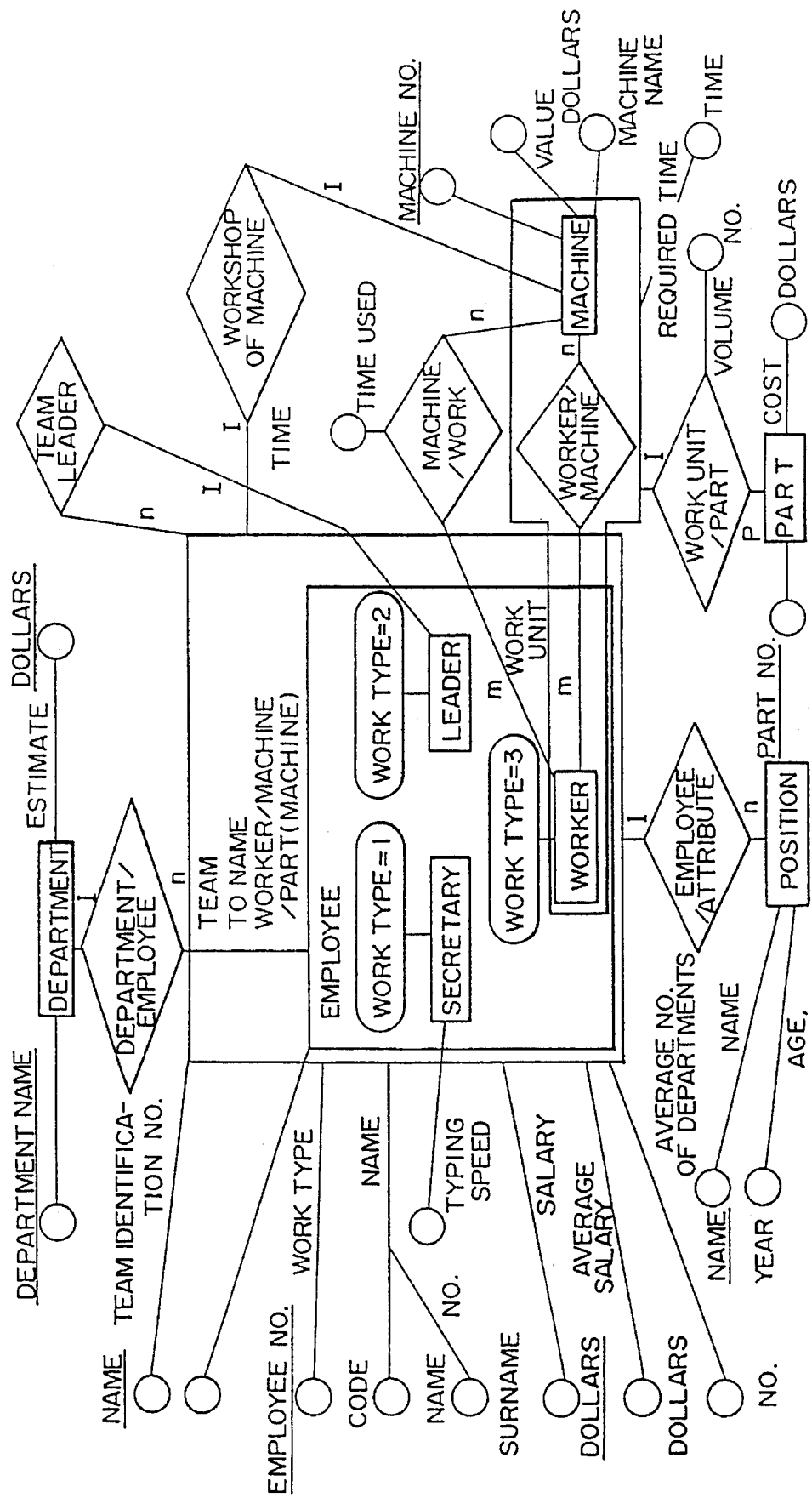
FIG. 2 is a diagram for explaining model forming for departments of a company.
Figure 3:
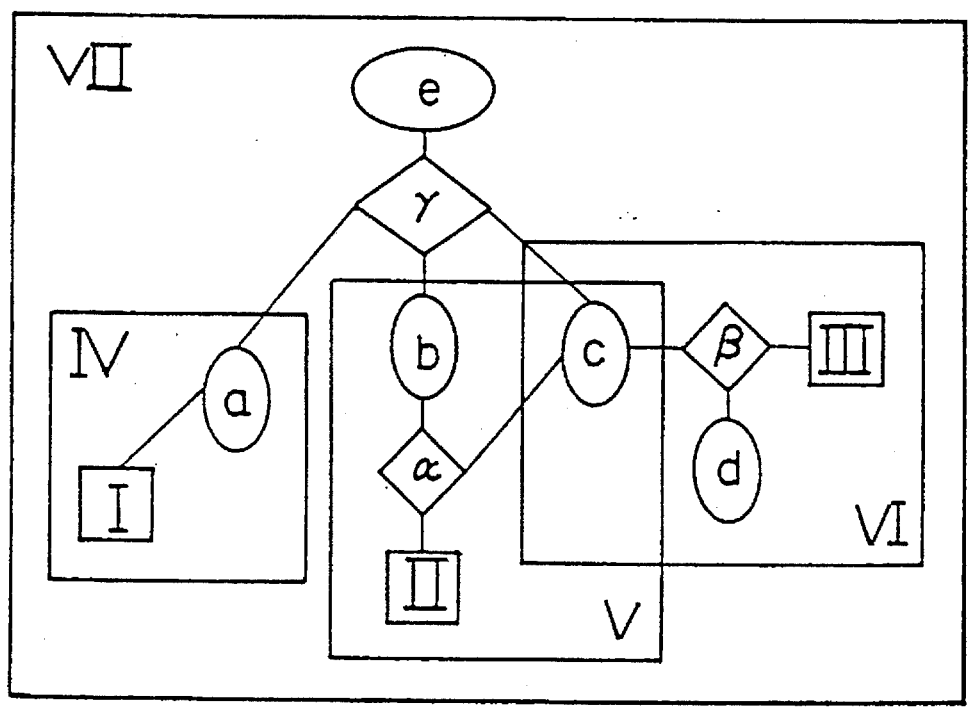
FIG. 3 is a diagram showing a model in an abstract form.

As described above with reference to FIGS. 1A through 1C, the objects are generally combined into target processing units in the form of the composite object, and becomes a unit for exhibiting a behavior for executing a process having a certain object. Such composite objects are stored in the parts attribute file 205 in the form of object parts 206 which are specified by the object commands 201.

When generating system corresponding to the new process request, that is, a new processing function, a new object is generated or the existing objects are linked depending on the target, and the object which exhibits the new processing function is prepared as one of the object parts 206, in order to enable the new processing function corresponding to the new process request.

A simulation is carried out with respect to the generated object so as to determine whether or not a correct function is actually obtained, or a provisional operation is carried out with respect to the generated objects for which the simulation is ended. Such a process corresponds to the provisional operation mode 216 shown in FIG. 9. The dynamic object process part 212 uses the content of the parts attribute file 205 to simulate the corresponding processing operation.

Figure 10:
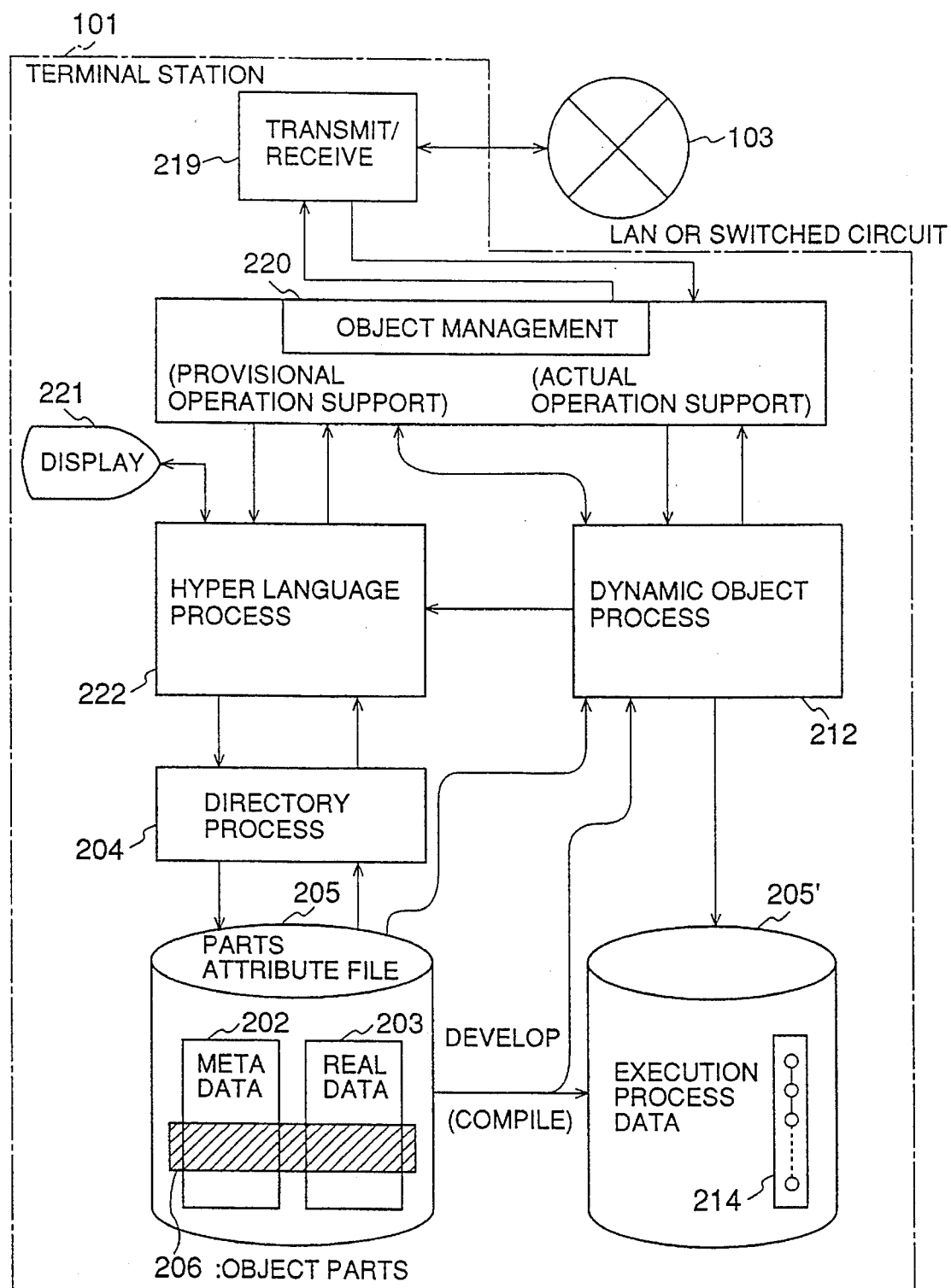
FIG. 10 is a system block diagram showing the construction of a terminal station.

The object 213 or the object group which operates normally in the provisional operation mode 216 is developed into the execution process data 214, that is, compiled into one execution process data 214, because the object 213 or the object group as it is requires a large number of communications with the object management part 220 shown in FIG. 10 and the processing speed is slow. This developing process is carried out in the direct object process developing process 215 and is stored in the parts attribute file 205'.

The dynamic object process part 212 uses the content of the parts attribute file 205 and temporarily carries out a substitute process with respect to a predetermined process. On the other hand, if becomes necessary to carry out a test process, the dynamic object process part 212 activates the direct object process developing process 215 to generate the execution process data 214 and carries out this process. In FIG. 9, such a process mode is indicated as the instant operation mode 217.

The actual operation mode 218 shown in FIG. 9 is a mode for actually carrying out the process using the execution process data 214 shown.

The semantic (meaning or significance) data related to the nature of the object is described in the meta data within the parts attribute file 205. In addition, it may be regarded that the link relationship of a certain object with respect to the object in the upper layer (object indicated by the "is-a" relationship), the link relationship of the certain object with respect to the object group in the lower layer and included in the certain object (group of objects indicated by the "part-of" relationship) and the like are also described in the meta data within the parts attribute file 205. The layer indicates the layer of a hierarchy relationship. In addition, the link relationship includes the strong link 500 and the weak link 501 described above.

FIG. 10 shows the construction of a terminal station. In FIG. 10, those parts which are the same as those corresponding parts in FIG. 9 are designated by the same reference numerals. A terminal station 101 shown in FIG. 10 executes the process using the execution process data 214, and communicates with another terminal station via a line 3. The line 3 is a line of a local area network (LAN), a switched circuit or the like.

A communication/reception process part 219, the object management part 220, a display 221, a hyper language process part 222 and the like exist within the terminal station 101.

A directory process part 204 shown in FIG. 10 can also be referred to as a command link process part or a directory process part. When one new object is formed, a command (object command) corresponding to the name of this new object is set, storage locations of real data 203 and meta data 202 are assigned, and a command link table is formed. In doing so, the type of the object is determined and the size is determined. Using the command link table, it is possible to input and output the combination of the meta data 202 and the real data 203.

In FIG. 10, a "provisional operation support" is a support function corresponding to the operation that is carried out until the provisional operation mode 216 shown in FIG. 9 is carried out.

The hyper language process part 222 shown in FIG. 10 has a "parts display/selection" function, and retrieves the usable object parts from the display 221 and outputs the same. If no appropriate object part exists, the hyper language process part 222 uses a "parts specify" function to specify a part as a new object part. The hyper language process part 222 can also generate a class object part by a "attribute set" function, and generate an instance object part by a "schema" function.

The "parts display" function using the display 221 includes (i) content display of names and comments of meta data of the object parts, (ii) display of schema and attribute indicating the content of the object parts, and (iii) display of class attributes and instance constants.

A "parts combine" function of the hyper language process part 222 combines the object parts to obtain a larger composite object part. For this "parts combine" function, there are provided a function of adding, modifying and deleting the attribute related to the formation of the classes, and a function of adding, modifying and deleting the schema related to the formation of the instance constants.

A "user screen form" function of the hyper language process part 222 forms the instance by inputting the screen data in the buffer of the "screen form and display" class when making the screen forming and display. For this reason, the "user screen form" function corresponds to forming the screen class into the form of the instance.

Figure 4A:
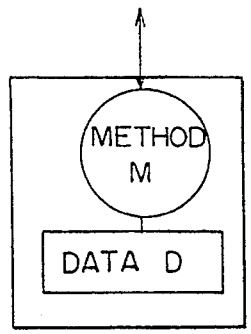
FIGS. 4A, 4B and 4C respectively are diagrams for explaining the capsule.
Figure 4B:
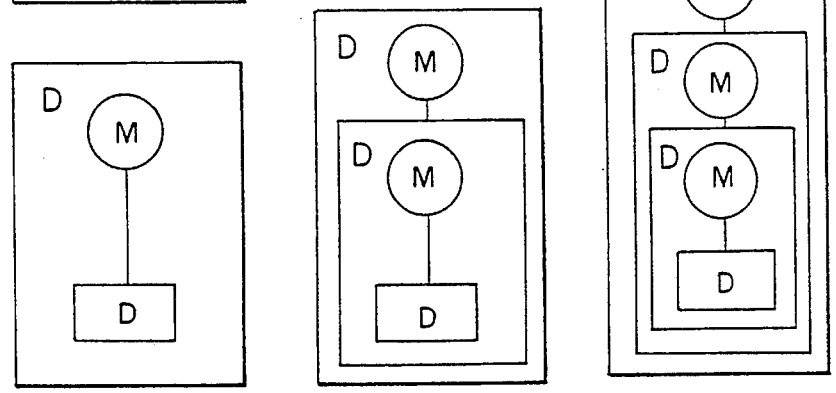
Figure 4C:
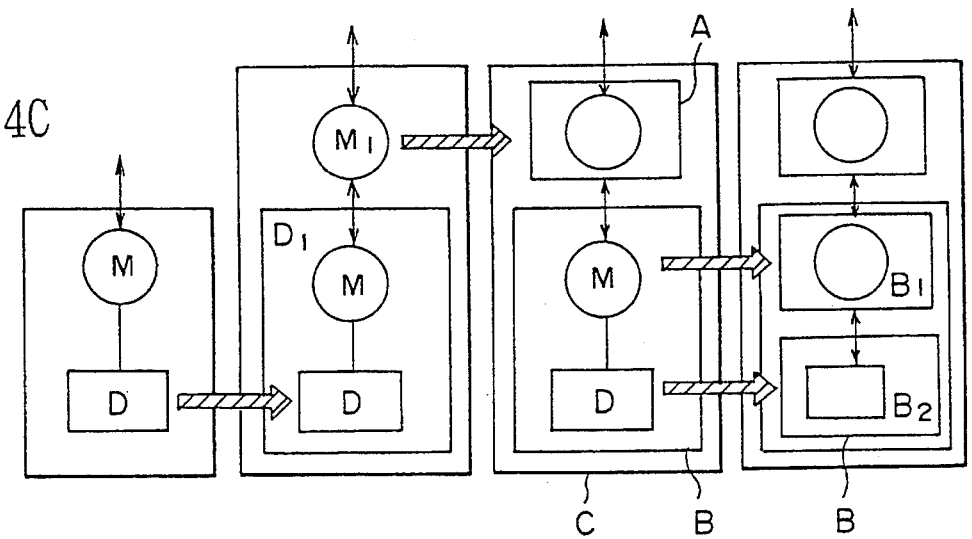

A "provisional operation" function of the hyper language process part 222 links the message to the method indicated by the class when the instance receives the message. Hence, the capsule shown in FIG. 4C is temporarily realized in a primary memory, and the behavior of the capsule is executed.

Furthermore, a "parts modify" function of the hyper language process part 222 is a function of modifying the object parts by modifying, adding and deleting the attribute and schema. In addition, a "parts register" function is a function of registering the object parts in the parts attribute file 205 by making the object parts correspond to the object commands which are the names of the object parts.

The "develop (compile)" shown in FIG. 10 indicates the direct object process developing process 215 shown in FIG. 9. The developing process makes a developing into a largest possible execution process data 214 depending on the side of the primary memory of the data processing system.

The object management part 220 controls the hyper language process part 222 shown in FIG. 10 to hold the object parts 206 in the parts attribute file 205, and controls the dynamic object process part 212 to carry out the provisional operation mode 216, the instant operation mode 217 and the actual operation mode 218. In addition, the instance is activated in the provisional operation mode 216 in correspondence with the message reception via the line 103, and a capsule is provisionally formed in the primary memory to operate the data processing system and to make a message transmission related to the result of the processing.

When carrying out the process within the terminal station 101, if the desired object part does not exist within the terminal station 101 or the attribute or schema does not exist, a data transfer is received from another terminal station via the line 103 to introduce the data within the terminal station 101 and carry out a learning process.

Figure 11:
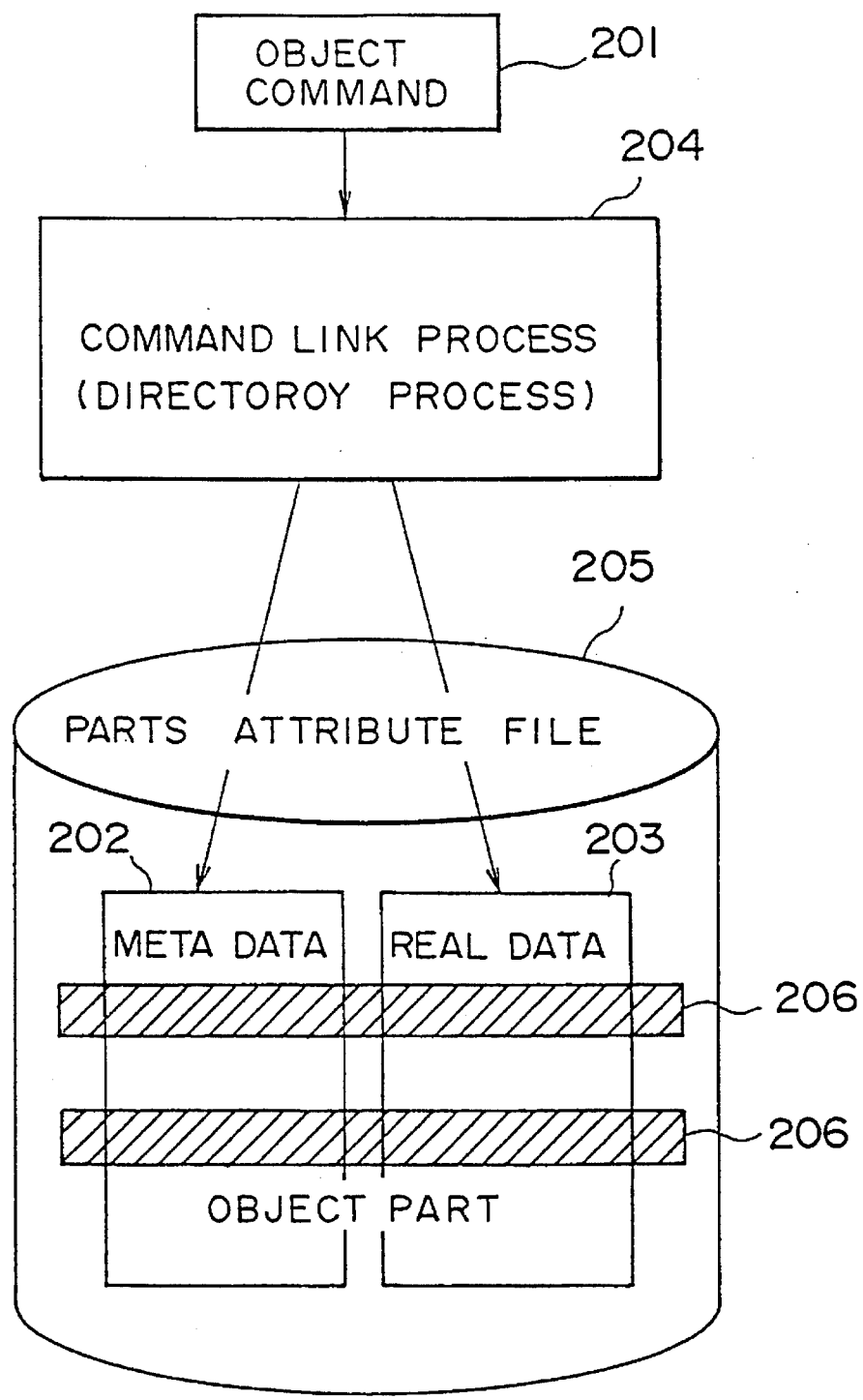
FIG. 11 is a diagram for explaining a process of treating the object.

FIG. 11 is a diagram for explaining the processing of treating the object.

The object parts 206 of the parts attribute file 205 shown in FIG. 11 may be regarded as being obtained by combining into one the user data within the conventional user data database and the meta data within the conventional meta data database. Of course, conventionally, the database management system for managing the user data database and the data dictionary and directory system for managing the meta data database operated independently of each other. In addition, accesses were made to the contents of the user data database and the contents of the meta data database independently of each other and used.

On the other hand, in FIG. 11, the real data 203 and the meta data 202 are combined, and is treated as one object part 206 by specifying it by the object command.

It is conceivable to combine the individual user data (entity data) of the user data database and the individual meta data of the meta data database, and treat the combinations as the object parts.

The targets to the treated as the object parts include primitive objects which are objects of the minimum scale, capsule objects which are successively combined, event objects, system objects and the like. For this reason, the targets to be treated are extremely complex and combined in a complicated manner. As a result, when one object is given, it may turn out that only the person who directly created the object can determine the nature or character of the object.

In view of the above, out of the meta data and the entity data forming the object parts, information such as descriptions on the entity data such as names and comments, semantic data model that gives a meaning to a third person, a general flow, a detailed flow, a source program is written in the meta data.

Accordingly, the object part in general has a sufficiently large amount of information, and it is desirable to give to the object part a name which simply describes the contents of the object part.

In the present invention, the names given to the objects describe the contents of the object parts related to the objects which may be combined, so that it is possible to make access to the object parts by the names. This name may be regarded as being the object ID described above.

Figure 12:
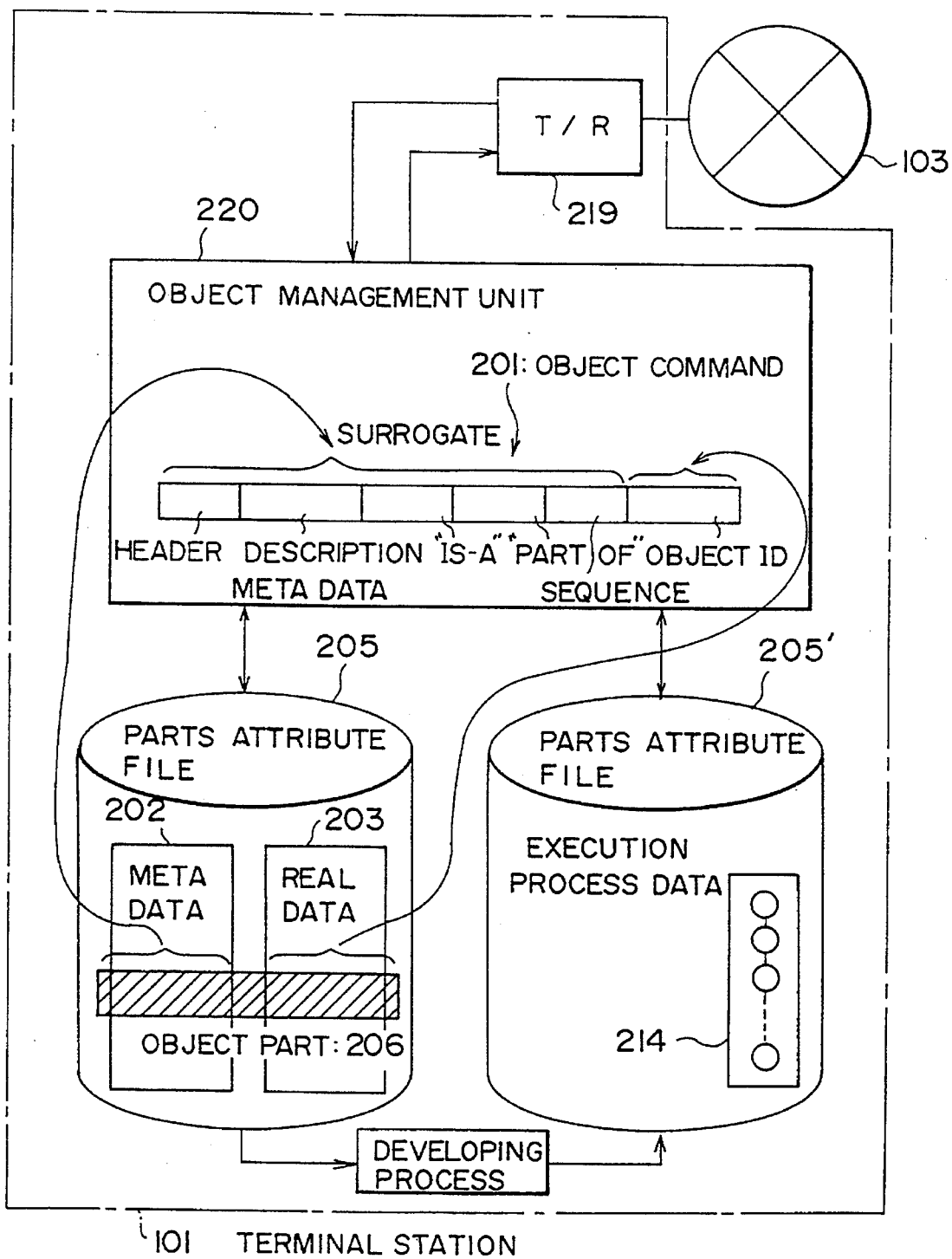
FIG. 12 is a diagram for explaining an object management.

FIG. 12 shows the construction of the terminal station 101 for carrying out the object management. The terminal station 101 forms the data processing system. The communication between the terminal station 101 and another terminal station (not shown) is made via the local area network (LAN) or switched circuit 103.

The terminal station 101 generally includes parts attribute files 205 and 205', a transmitter/receiver 219, and an object management unit 220. The parts attribute file 205 includes meta data 202, real data 203, and object parts 206. The parts attribute file 205' is the same as the parts attribute file 205 and includes an execution process data 214. The execution process data 214 is obtained by compiling one or a combination of the object parts and developing the compiled result in a form suited for the actual execution process.

The object command 201 in the object management unit 220 is given as a name for specifying the object part 206. The object command 201 is generally divided into a surrogate (or signature) and an object ID. The surrogate is made up of parts (i) through (vi) described hereunder.

(i) Header: The header specifies the byte from which predetermined information starts and the number of bytes in which the predetermined information exists. The predetermined information includes a descriptive region which will be described later, an "is-a" hierarchy, a "part-of" hierarchy, a sequence and the like.

(ii) Descriptive region: The descriptive region is a summary of the description related to the object, and the meta data in its original sense with respect to the object is written in a compressed form. For example, a part corresponding to the description such as "who made" and "which version" is compressed and written with respect to the object.

(iii) "Is-a" hierarchy: In the case of a description "a dog is an animal", a hierarchical relationship is used by positioning "dog" in a lower hierarchy as-opposed to "animal" in a higher hierarchy, so as to describe the relative position of the dog. In other words, in the "is-a" hierarchy, "dog" and the like of the lower hierarchy exist with respect to "animal" in the higher hierarchy.

(iv) "Part-of" hierarchy: For example, "Illinois", "Texas" and "California" form a part of "U.S.A.". A relationship between "Illinois", for example, which forms a part of "U.S.A.", and "U.S.A." is described as a "part-of" hierarchy.

(v) Sequence: A composite object is a complex combination of smaller objects. The sequence describes in a compressed form a part which specifies the execution sequence (including branching) of the group of smaller objects.

(vi) Object ID: The same ID which is conventionally added to the data stored in the user data database is used as the object ID.

The object management unit 220 has functions such as generating a new object part 206 within the parts attribute file 205, correcting and deleting existing object parts, integrating a plurality of object parts into a single object part, and dividing a single object part into a plurality of object parts. In addition, the object management unit 220 also has a function of communicating with a plurality of objects and carrying out a process which is appropriate for the desired processing target by assigning a processing sequence to the individual objects, that is, by ordering the individual objects.

When carrying out the various kinds of processes described above, the object management unit 220 specifies the individual object parts by the object command 201.

The compiling is made if necessary with respect to the group of object parts which are ordered in the above described manner or with respect to the individual object parts, so as to generate the execution process data 214. The execution process data 214 is used when carrying out a data processing within the terminal station 101 or making a communication with another terminal station via the LAN or switched circuit 103. Since the object parts are compiled, the file access is minimized and the data processing or the like can be carried out at a high speed.

Figure 13A:
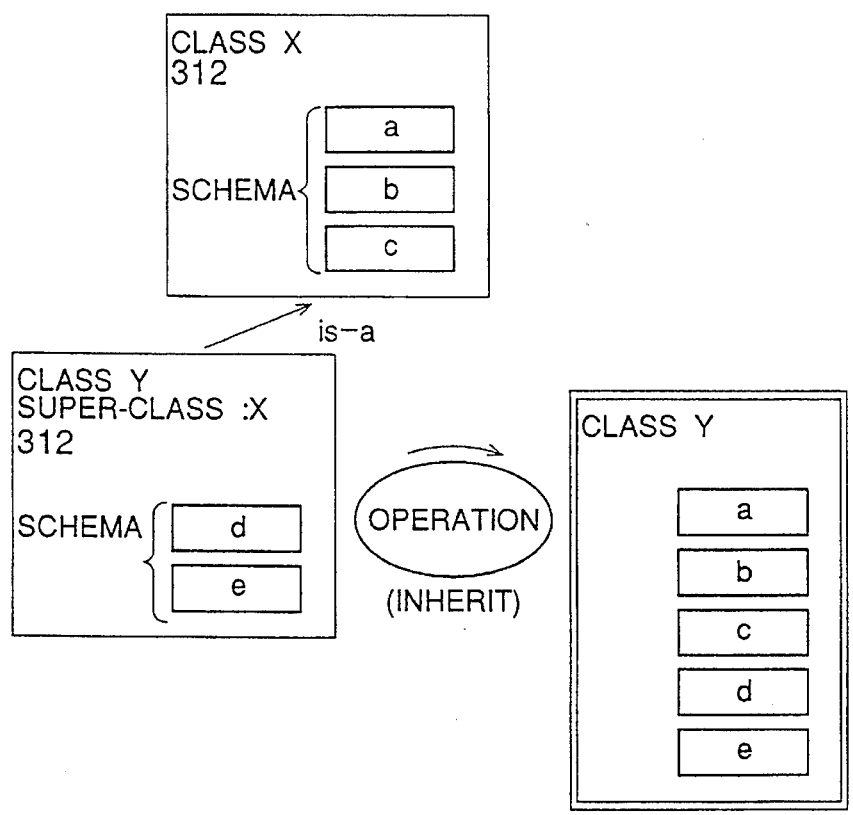
FIGS. 13A and 13B respectively are diagrams for explaining the relationship among a plurality of classes.
Figure 13B:
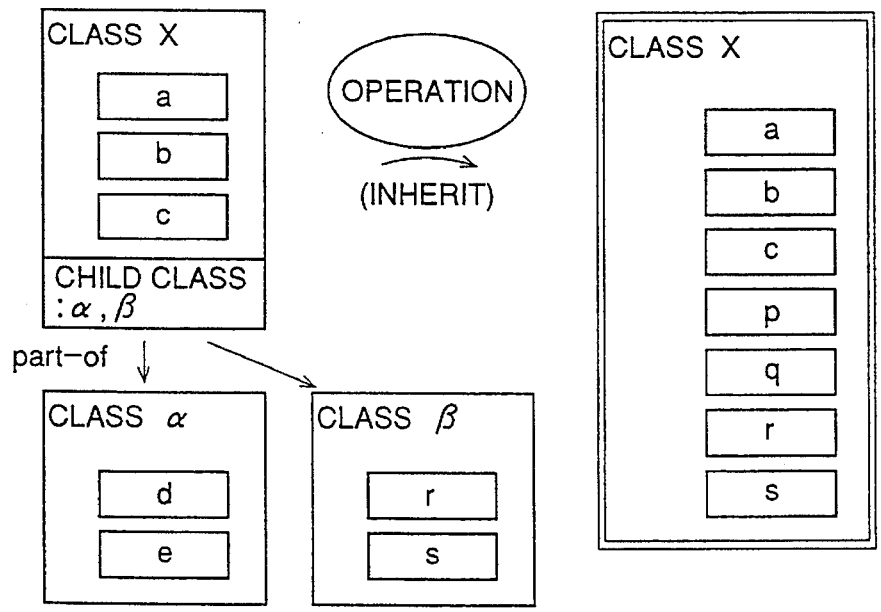

FIGS. 13A and 13B are diagrams for explaining the relationships among a plurality of classes.

FIG. 13A shows a case where a class Y has the "is-a" relationship to a class X. For example, the class X is a program related to "vehicle", and the class Y is a program related to "automobile".

In the case shown in FIG. 13A, methods a, b and c are introduced in relation to the class X, and methods d and e are introduced in relation to the class Y. In such a case, when an instruction specifies execution of the class Y, the methods a, b and c are inherited from the class X when executing the class Y, thereby executing a process based on the methods a, b, c, d and e.

FIG. 13B shows a case where classes α and β have the "part-of" relationship with respect to the class X. For example, the class X is a program related to "vehicle", and the classes α and β respectively are programs related to one of "chassis", "engine", "wheel" and the like.

In the case shown in FIG. 13B, methods a, b and c are introduced in relation to the class X, methods p and q are introduced in relation to the class α, and methods r and s are introduced in relation to the class β. In such a case, when an instruction specifies execution of the class X, a process is executed based on the methods a, b, c, p, q, r and s when executing the class X.

Although the "is-a" relationship and the "part-of" relationship are shown as examples of the template, the template is of course not limited to such.

In the present invention, the system corresponding to the new request is understood in the form of classes and instances, so that the processing target can freely be designed and can be easily used by another process at a later date. In doing so, it is necessary to correctly cope with the restrictions of the cause and effect relationships described above in relation to FIG. 6.

Figure 14:
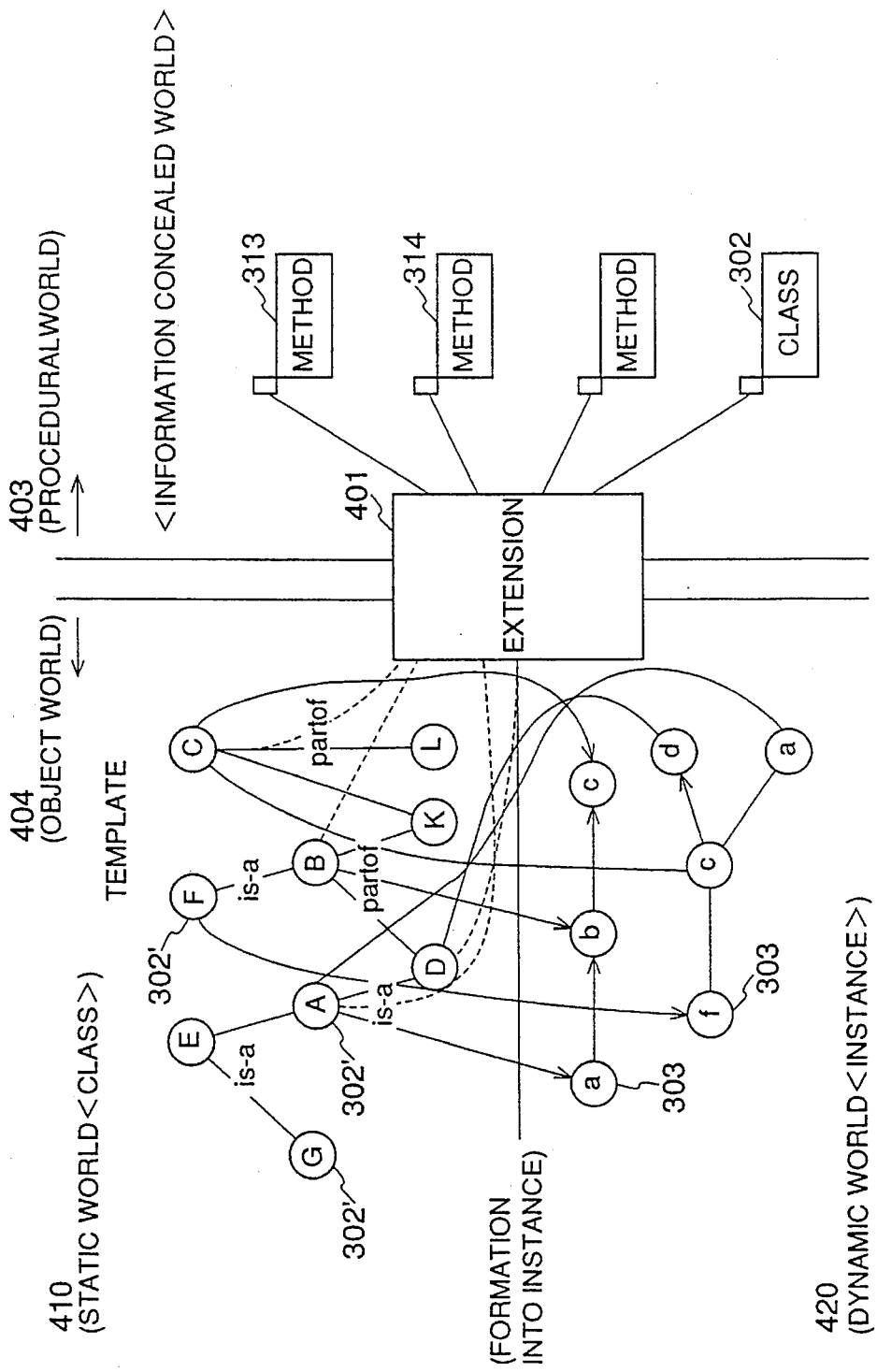
FIG. 14 is a diagram for explaining a process execution.

FIG. 14 is a diagram for explaining the process execution. FIG. 14 shows an extension 401 which corresponds to the extension shown in FIG. 7, a procedural world 403 which corresponds to the connotation shown in FIG. 7, and an object world 404 which represents the model of the real world.

When forming the model of the real world (for example, the requested target system), the present invention uses a static world 4 and a dynamic world 420. The static world 410 specifies the relationship among the classes and/or methods which are required to form the model. On the other hand, the dynamic world 420 specifies the time sequential relationship of the processes of the instances which are obtained when forming the model.

The classes and/or methods specified in the static world 410, and composite classes which are respectively obtained by adding or integrating the classes, are represented hereinafter by classes 302'.

On the other hand, a class 302 exists in the procedural world 403 shown in FIG. 14. Instances 303 exist in the dynamic world 420 shown in FIG. 14, and methods 313, 314, . . . exist in the procedural world 403 shown in FIG. 14.

The methods 313, 314, . . . are existing processing units for respectively executing the individual processes. In order to execute a more complex process, a plurality of methods are introduced from the group of methods to form the class 302. Further, if necessary, a plurality of classes are introduced from the group of classes and a plurality of methods are introduced from the group of methods to form a composite class in order to execute a more complex process. Such classes 302 and the composite classes respectively correspond to one object unit.

It will be assumed for the sake of convenience that such methods and classes already exist.

For example, suppose that a user requests processing of a target process for a certain kind of process. In the present invention, the classes and methods required to process the target process are introduced in order to process the target process, and the mutual relationships among the classes and methods are determined. The static world 410 describes information related to the mutual relationships.

In the case shown in FIG. 14, A, B, C, D, E, F, G, K and L are introduced as the classes 302' for the purpose of processing the target process. (i) The classes G and A respectively have the "is-a" relationship with respect to the class E, (ii) the class D has the "is-a" relationship with respect to the class A, (iii) the class B has the "is-a" relationship with respect to the class F, (iv) the classes D and K respectively have the "part-of" relationship with respect to the class C, and (v) the classes K and L respectively have the "part-of" relationship with respect to the class C. Actually, the class 302' described in the static world 410 is given by use of an identification (ID) or identifier which is sufficient to point the class 302, the method 313 or the like existing in the procedural world 403.

The classes 302' have corresponding relationships to the classes and methods existing in the procedural world 403. In other words, the classes 302' are programs for executing the individual processes and are similar to formulas in mathematics, where it may be regarded that the values within the programs are given by general variables. The instances 303 are obtained by setting the instance data with respect to the general variables of the classes 302' and forming specific programs in which the individual instance data are assembled.

In the dynamic world 420, the processing time sequence of instances a, b, c, . . . corresponding to the classes 302' introduced in the static world 410 are specified, and the process requested by the user is executed.

As described above, if the user requests processing of a certain target process, for example, the classes A, B, C, D, E, F, K and L are specified in the static world 410 as the classes 302' which are required for the processing of the target process. In addition, the relationships such as "is-a" and "part-of" relationships are clarified among the classes 302'. Actually, a state table is prepared and the relationships are described in the state table. If restrictions exist among the classes 302' in respect of the cause and effect relationship, information related to such restrictions are also described in the state table.

When processing the target process requested from the user, the introduced classes 302' are not used as they are. In other words, the instances 303 in which the individual instance data are set, are used with respect to the general variables within each of the classes 302'. In addition, the processing is made according to the time sequential relationship of each of the instances which are processed.

In the case shown in FIG. 14, the instance a corresponding to the class A, the instance b corresponding to the class B, the instance c corresponding to the class C, the instance d corresponding to the class D, and the instance f corresponding to the class F are generated. In addition, there are shown (i) a session in which the instances a, b and c advance in this sequence, and (ii) a session in which the instances f, c, d and a advance in this sequence.

When generating the instance a, the instance a is of course generated using the class A which corresponds to the formula. In this case, since the class A has the "is-a" relationship with respect to the class E, it is regarded that the contents indicated in the class E are inherited to the class A, and the instance a is generated using both the classes E and A.

On the other hand, since the classes D and K respectively have the "part-of" relationship with respect to the class B, the instance b is generated using the classes B, D and K.

When executing each session, the state table described above existing in the static world 410 is inspected and the start of execution of the instance a, for example is written into the state table when starting the execution of the instance a. When the processing of the instance a ends, this end is written into the state table. Hence, the restrictions corresponding to the cause and effect relationship existing in and described in the static world 410 are written into the state table without omission. Of course, new restrictions may be generated, but the new restrictions can be given in correspondence with each of the sessions. For example, such new restrictions may be generated in respect of the cause and effect relationship caused by the assembling of the session under the state where the individual instances a, b, c, . . . are generated. However, the cause and effect relationship generated when the classes 302' are introduced and related in the static world 410 are described in the static world 410, and is inherited to the processing of the session in the dynamic world 420.

Figure 15:
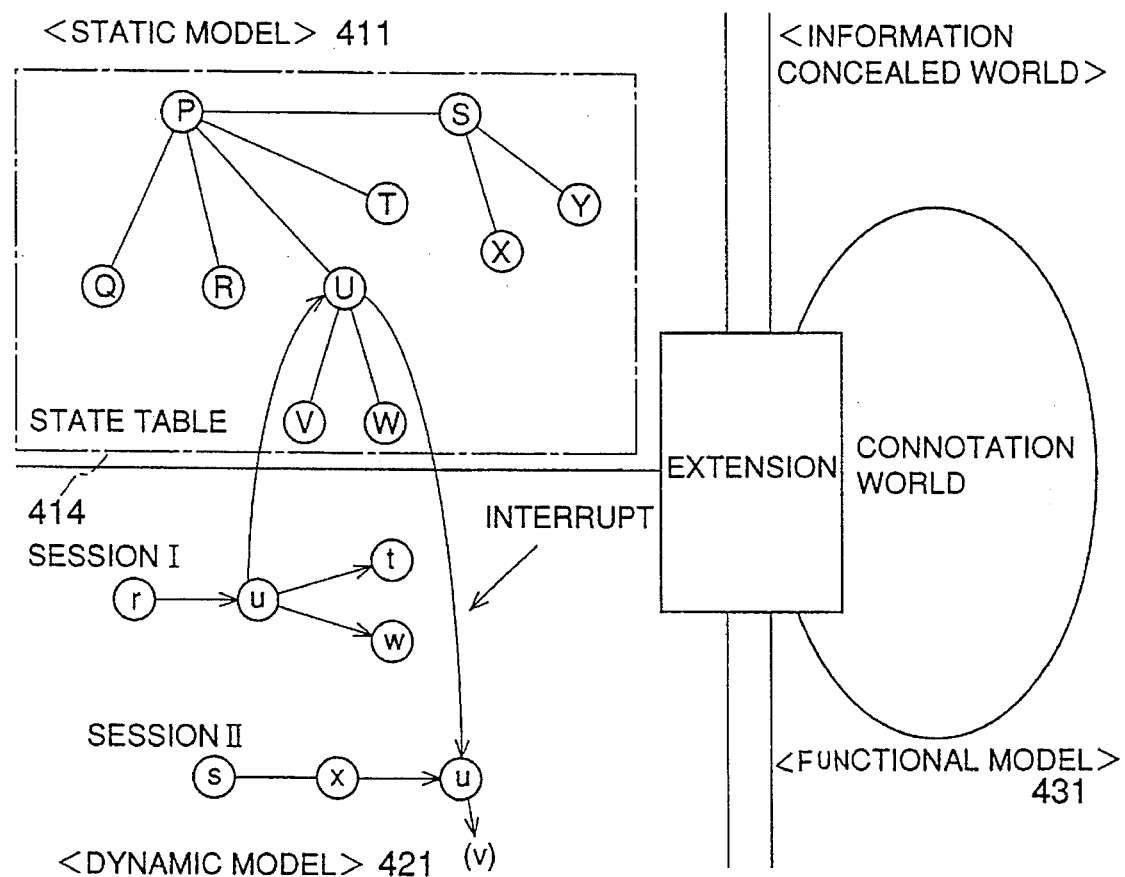
FIG. 15 is a diagram for explaining a state table and the introduction of the cause and effect relationship when executing a session.

FIG. 15 is a diagram for explaining the introduction of the cause and effect relationship when executing a session. In FIG. 15, elements 411, 421 and 431 respectively correspond to the same reference numerals in FIG. 8. In addition, an element 414 in FIG. 15 indicates the same state table as that shown in FIG. 6.

In the case shown in FIG. 15, it is indicated that classes P through Y are introduced as the information within the state table 414 for a certain process. The classes Q, R, S, T and U exist under the class P, the classes X and Y exist under the class S, and the classes V and W exist under the class U. In addition, instances r, u, t, w, s and x are generated and the session is assembled.

A session I and a session II are executed under the dynamic model 421. However, during the time when the individual instances such as the instance u carries out its own process, it is unnecessary to take into consideration the cause and effect relationships with the other instances. For example, the content of the state table 414 is inspected at the time when the instance u starts its own process, and the process is executed after checking whether or not no violation is made with respect to the restrictions of the cause and effect relationship. It is sufficient to report the cause and effect relationship to the state table 414 at the time when the process of the instance u is ended.

In a case where, as a result of executing the instance u in the session I, it becomes necessary to execute another instance v instead of executing the instance u in the session II, a branch is made to the instance v by making an interrupt to the instance u of the session II based on the execution end report of the instance u of the session I. Alternatively, the dynamic model 421 is notified of the above when starting the instance u of the session II.

Figure 16:
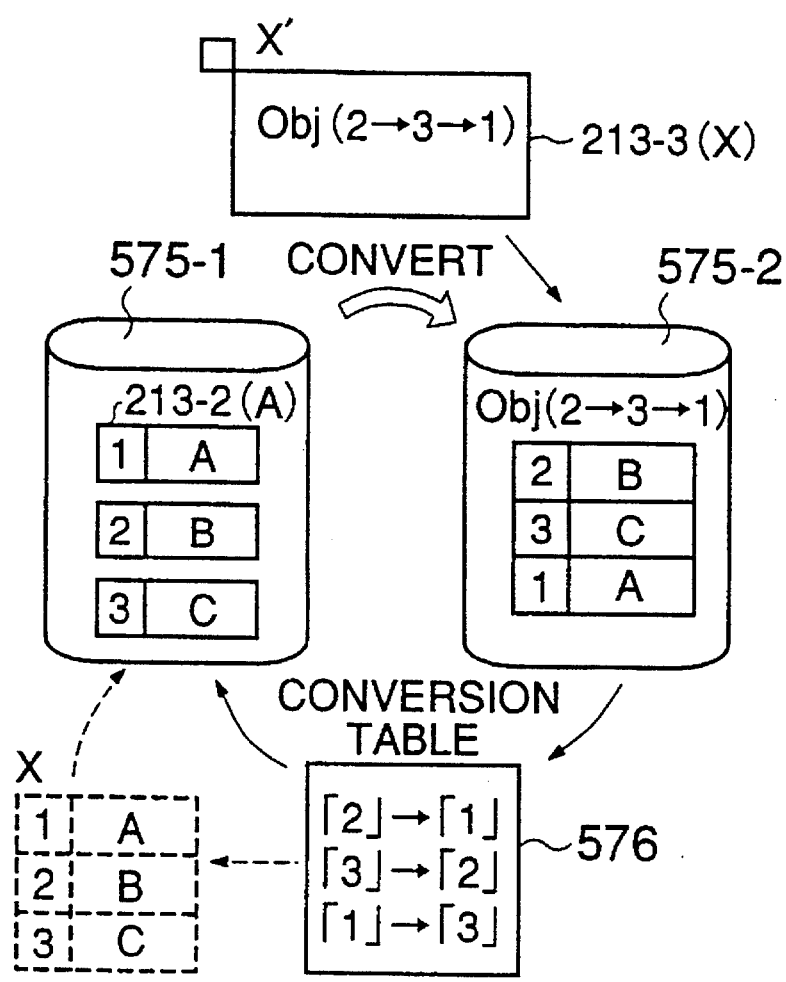
FIG. 16 is a diagram for explaining generation and disassembling of a composite object and a primitive object.

FIG. 16 is a diagram for explaining the generation and disassembling of the composite object. In FIG. 16, those parts which are the same as those corresponding parts in FIG. 5 are designated by the same reference numerals. In other words, FIG. 16 shows primitive objects 213-2, composite objects 213-3, and files 575-1 and 575-2. Also shown in FIG. 16 is a conversion table 576.

In the case shown in FIG. 16, the file 575-1 which stores a group of primitive objects 213-2 and the file 575-2 which stores a group of composite objects 213-3 are constructed independently. The file 575-1 is sometimes referred to as the data file, and the file 575-2 is sometimes referred to as the collection (or set) file.

It will be assumed for the sake of convenience that there exists a composite file X (not shown), and a primitive object A having an object ID "1", a primitive object B having an object ID "2", and a primitive object C having an object ID "3" are stored within the data file 575-1. In this state, it is assumed tat a composite object X' which executes the primitive objects B, C and A in this sequence is generated, and that the generated composite object X' is stored within the collection file 575-2 so that the composite object X' can be used at a later date. The object IDs are linked in the sequence "2"→"3"→"1" to correspond to the composite object X', and the composite object X' is obtained. One group ((2, B), (3, C), (1, A)) corresponding to the composite object X' is stored in the collection file 575-2 and assigned an object ID corresponding to the composite object X' such as the object ID (2→3→1), for example.

On the other hand, when disassembling the generated composite object X' to obtain the primitive objects A, B and C, the structure of the primitive objects in the original composite object X is taken into consideration, and the disassembling to the primitive objects can be made by making the object ID "2" correspond to the object ID "1", the object ID "3" correspond to the object ID "2", and the object ID "1" correspond to the object ID "3".

Figure 17:
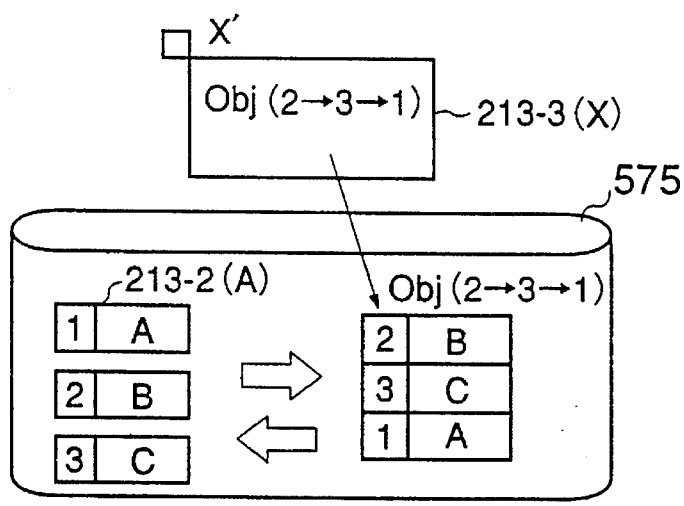
FIG. 17 is a diagram for explaining the storage of the composite object.

FIG. 17 shows the structure for a case where the composite object is also stored within the single file. In FIG. 17, those parts which are the same as those corresponding parts in FIG. 16 are designated by the same reference numerals. The object ID ("2"→"3"→"1" ) is assigned with respect to the composite object X' which is to be generated, and one group ((2, B), (3, C), (1, A)) is generated in the file 575. The disassembling of the generated composite object X' is made similarly to that described above with reference to FIG. 16.

According to the structure shown in FIG. 17, the generated composite object X' may remain in the file even when the frequency of the composite object X' being used again is small. However, appropriate considerations may be made with regard to the management for this case.

Figure 18:
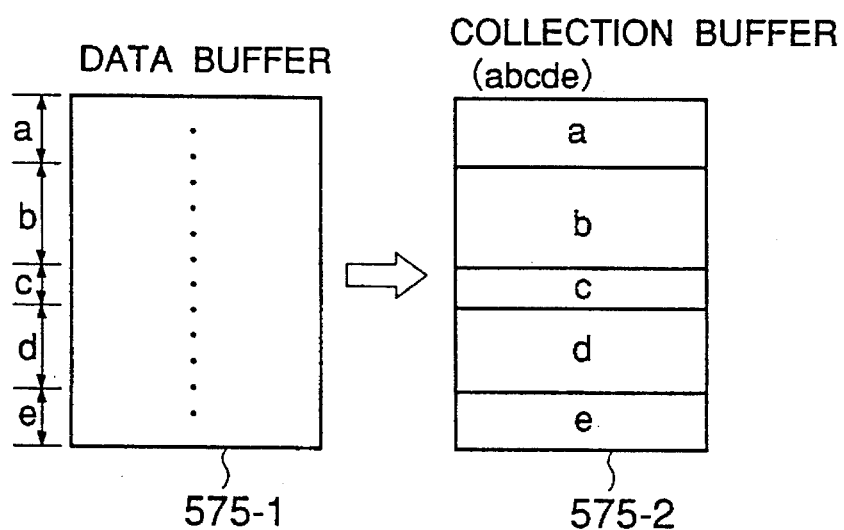
FIG. 18 is a diagram for explaining the obtaining a composite object by using the existing contents of the data file.

FIG. 18 is a diagram for explaining how a composite object (abcde) is obtained using the existing contents of the data file. In the case shown in FIG. 18, the existing data file 575-1 exists, and parts (a), (b), (c), (d) and (e) within the data file 575-1 are the primitive objects forming the composite object (abcde) which is to be generated. In this case, the data file 575-1 may be treated as it is as the collection file 575-2 if the boundaries among each of the primitive objects are given with respect to the contents of the data file 575-1.

Figure 19:
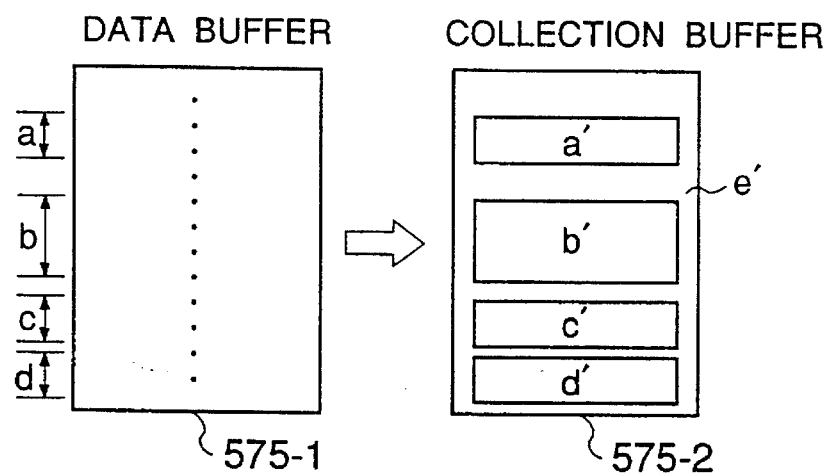
FIG. 19 is a diagram for explaining the obtaining of another composite object using the existing contents of the data file.

FIG. 19 is a diagram for explaining how a composite object (a'b'c'd'e') is obtained using the existing contents of the data file. In the case shown in FIG. 19, the existing data file 575-1 exists, similarly to the case shown in FIG. 18. In FIG. 19, primitive buffers a', b', c' and d' are appropriately combined, and a remaining portion is regarded as a primitive buffer e'.

In FIGS. 18 and 19, the sectioned primitive objects a, b, c, ..., d' may be used for generating other composite objects.

Figure 20:
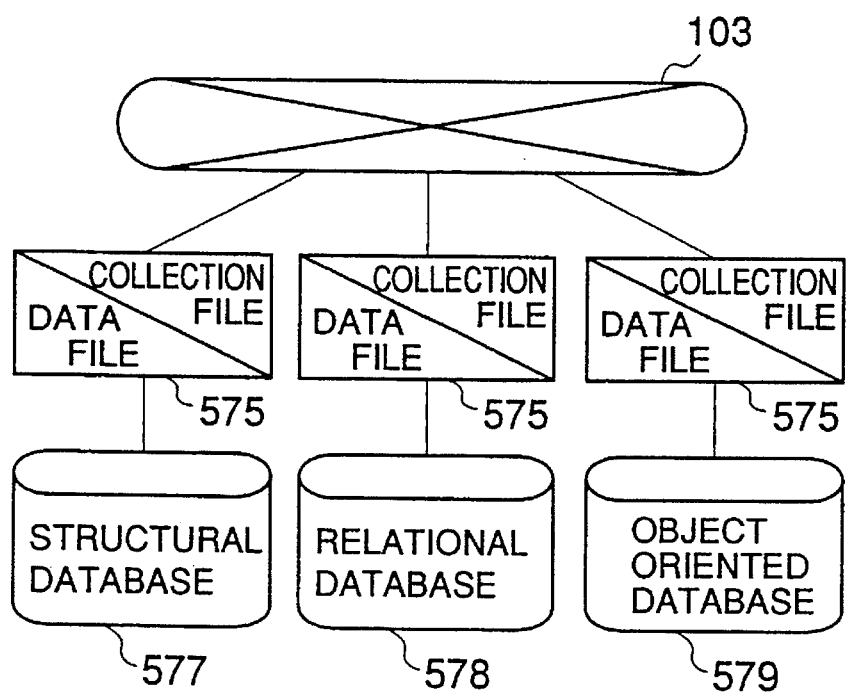
FIG. 20 is a system block diagram showing an application of the present invention.

FIG. 20 shows an application of the present invention, wherein the data file and the collection file exist. FIG. 20 shows a LAN or switched circuit 103, a file 575, a structural database 577, a relational database 578, and an object oriented database 579.

By disassembling the object into the primitive objects and appropriately generating the composite objects as in the case of the present invention, it becomes easy to exchange information among different kinds of databases. This is because each processing unit can be treated in the level of the primitive objects and the combining and disassembling of the objects can be made if necessary.

Figure 21:
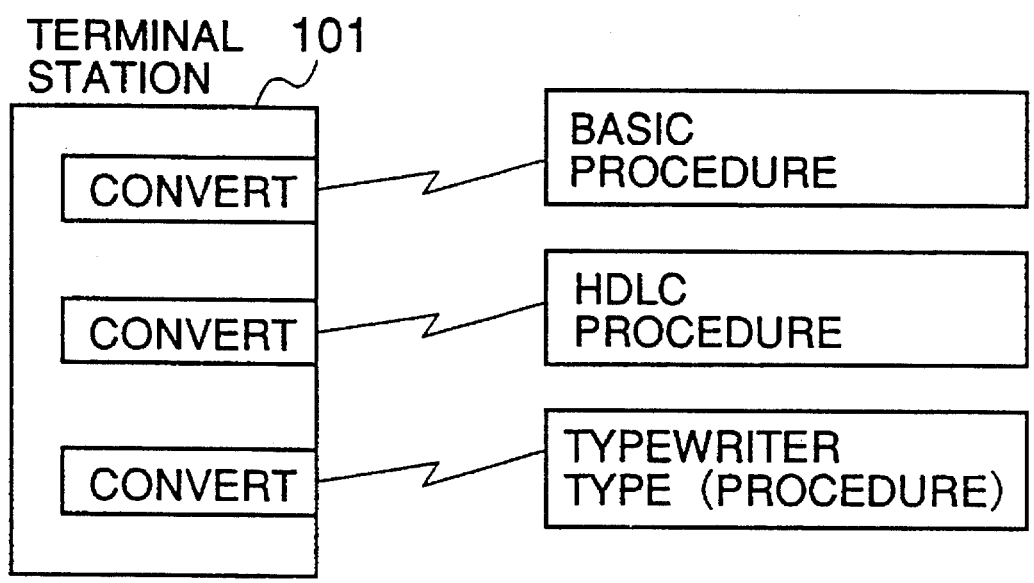
FIG. 21 is a system block diagram showing another application of the present invention.

FIG. 21 shows another application of the present invention which enables communication among communication systems employing different procedures. In a terminal station 101 shown in FIG. 21, there are provided converting means for combining the objects so as to conform to the respective communication procedures such as the basic procedure, the high level data link control (HDLC) procedure and the non-procedure. Hence, it is possible to make the communication with respect to communication systems employing different communication procedures with ease by combing the objects if necessary.

Further, the present invention is not limited to these embodiments, but various variations and modifications may be made without departing from the scope of the present invention.

What is claimed is:

1. A data processing system for executing a process, comprising:

means for forming classes and composite classes by combining methods;

means for forming instances which correspond to the classes and composite classes;

means for analyzing the real world as an object model which includes a static world, a dynamic world and a cause and effect relationship, the object model having a corresponding extension and a corresponding connotation, the connotation being in an information concealed region, and identification information identifies the extension and connotation;

means for creating a system mechanism with respect to the static world using the classes and composite classes, the system mechanism being a static model for the static world;

means for using the instances to form a session corresponding to motion with respect to the dynamic world, the session being a dynamic model for the dynamic world, the cause and effect relationship of the object model being generated from the dynamic model into the static model;

means for forming a functional model in the connotation, the functional model including composite objects formed from the methods, the classes, the composite classes and the session;

means for storing, in the connotation, a minimum number of methods, classes, and composite classes required to form the composite objects of the functional model;

means for using the identification information to assign object identifications to composite objects of the functional model, to identify composite objects of the functional model; and means for executing a process by using the object identifications to identify composite objects of the function model for use in the process.

2. The data processing system as claimed in claim 1, further comprising:

a file formed in the connotation; and means for storing the composite objects of the functional model, together with the assigned object identifications, into the file by grouping the minimum number of methods, classes, and composite classes required to form the composite objects.

3. The data processing system as claimed in claim 1, further comprising:

a first file and a second file formed in the connotation;

means for storing the minimum number of methods, classes, and composite classes required to form the composite objects into the first file;

means for storing the composite objects of the functional model, together with the assigned object identifications, into the second file.

4. A method for executing a process, comprising the steps of:

forming classes and composite classes by combining methods;

forming instances which correspond to the classes and composite classes;

analyzing the real world as an object model which includes a static world, a dynamic world and a cause and effect relationship, the object model having a corresponding extension and a corresponding connotation, the connotation being in an information concealed region, and identification information identifies the extension and connotation;

creating a system mechanism with respect to the static world using the classes and composite classes, the system mechanism being a static model for the static world;

using the instances to form a session corresponding to motion with respect to the dynamic world, the session being a dynamic model for the dynamic world, the cause and effect relationship of the object model being generated from the dynamic model into the static model;

forming a functional model in the connotation, the functional model including composite objects formed from the methods, the classes, the composite classes and the session;

storing, in the connotation, a minimum number of methods, classes, and composite classes required to form the composite objects of the functional model;

using the identification information to assign object identifications to composite objects of the functional model, to identify composite objects of the functional model; and executing a process by using the object identifications to identify composite objects of the function model for use in the process.

5. The method as claimed in claim 4, further comprising:

forming a file in the connotation; and storing the composite objects of the functional model, together with the assigned object identifications, into the file by grouping the minimum number of methods, classes, and composite classes required to form the composite objects.

6. The method as claimed in claim 4, further comprising:

forming a first file and a second file formed in the connotation;

storing the minimum number of methods, classes, and composite classes required to form the composite objects into the first file;

storing the composite objects of the functional model, together with the assigned object identifications, into the second file.

* * * * *